(12) United States Patent
Sills et al.

(10) Patent No.: US 8,603,884 B2
(45) Date of Patent: *Dec. 10, 2013

(54) METHODS OF FABRICATING SUBSTRATES

(75) Inventors: Scott Sills, Boise, ID (US); Gurtej S. Sandhu, Boise, ID (US); Anton deVilliers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/596,430

(22) Filed: Aug. 28, 2012

(65) Prior Publication Data

US 2012/0322269 A1 Dec. 20, 2012

Related U.S. Application Data

(63) Continuation of application No. 12/328,435, filed on Dec. 4, 2008, now Pat. No. 8,273,634.

(51) Int. Cl.
*H01L 21/331* (2006.01)
*H01L 21/8222* (2006.01)

(52) U.S. Cl.
USPC ........... 438/312; 438/313; 438/323; 438/394; 438/551; 438/669; 438/671; 438/710; 438/717

(58) Field of Classification Search
None
See application file for complete search history.

(56) References Cited

U.S. PATENT DOCUMENTS

| | | | |
|---|---|---|---|
| 4,910,168 A | 3/1990 | Tsai | |
| 5,008,207 A | 4/1991 | Blouse et al. | |
| 5,013,680 A | 5/1991 | Lowrey et al. | |
| 5,047,117 A | 9/1991 | Roberts | |
| 5,254,218 A | 10/1993 | Roberts et al. | |
| 5,328,810 A | 7/1994 | Lowrey et al. | |
| 5,372,916 A | 12/1994 | Ogawa et al. | |
| 5,382,315 A * | 1/1995 | Kumar | 216/39 |
| 5,420,067 A * | 5/1995 | Hsu | 438/700 |
| 5,429,988 A * | 7/1995 | Huang et al. | 438/587 |
| 5,573,837 A | 11/1996 | Roberts et al. | |
| 5,593,813 A | 1/1997 | Kim | |

(Continued)

FOREIGN PATENT DOCUMENTS

| | | |
|---|---|---|
| CN | 1550889 | 12/2004 |
| CN | 1752844 | 3/2006 |

(Continued)

OTHER PUBLICATIONS

U.S. Appl. No. 11/714,378, filed Mar. 5, 2007, Preliminary Amendment.

(Continued)

*Primary Examiner* — Duy Deo
(74) *Attorney, Agent, or Firm* — Wells St. John, P.S.

(57) ABSTRACT

A method of fabricating a substrate includes forming first and second spaced features over a substrate. The first spaced features have elevationally outermost regions which are different in composition from elevationally outermost regions of the second spaced features. The first and second spaced features alternate with one another. Every other first feature is removed from the substrate and pairs of immediately adjacent second features are formed which alternate with individual of remaining of the first features. After such act of removing, the substrate is processed through a mask pattern comprising the pairs of immediately adjacent second features which alternate with individual of the remaining of the first features. Other embodiments are disclosed.

48 Claims, 13 Drawing Sheets

(56) References Cited

U.S. PATENT DOCUMENTS

| | | |
|---|---|---|
| 5,616,510 A | 4/1997 | Wong |
| 5,905,279 A | 5/1999 | Nitayama et al. |
| 5,916,821 A | 6/1999 | Kerber |
| 6,063,688 A | 5/2000 | Doyle et al. |
| 6,087,263 A | 7/2000 | Clampitt et al. |
| 6,140,217 A | 10/2000 | Jones et al. |
| 6,207,490 B1 | 3/2001 | Lee |
| 6,235,574 B1 | 5/2001 | Tobben et al. |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1 | 5/2002 | Subramanian et al. |
| 6,429,123 B1 | 8/2002 | Tseng |
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,956 B2 | 11/2003 | Yoshida et al. |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lei et al. |
| 6,735,132 B2 | 5/2004 | Siek |
| 6,753,220 B2 | 6/2004 | Jeungling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 7,023,069 B2 | 4/2006 | Blanchard |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Busch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,842,601 B2 | 11/2010 | Lee et al. |
| 7,846,646 B2 | 12/2010 | Kamijima |
| 7,851,135 B2 | 12/2010 | Jung et al. |
| 7,855,038 B2 | 12/2010 | Hah et al. |
| 7,959,818 B2 | 6/2011 | Jung |
| 8,083,953 B2 | 12/2011 | Millward et al. |
| 8,083,958 B2 | 12/2011 | Li et al. |
| 8,148,052 B2 | 4/2012 | Vanleenhove et al. |
| 8,247,302 B2 * | 8/2012 | Sills et al. ............ 438/312 |
| 8,273,634 B2 * | 9/2012 | Sills et al. ............ 438/312 |
| 8,440,576 B2 | 5/2013 | Hong |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Yoshida et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jim |
| 2005/0214683 A1 | 9/2005 | Nishimura et al. |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0286795 A1 | 12/2006 | Yosho |
| 2007/0003878 A1 | 1/2007 | Paxton et al. |
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandoia et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schlosser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |

(56) References Cited

U.S. PATENT DOCUMENTS

| | | |
|---|---|---|
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0120900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1 | 8/2009 | Cheng et al. |
| 2009/0291397 A1 | 11/2009 | deVilliers |
| 2009/0298274 A1 | 12/2009 | Kajiware |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh et al. |
| 2010/0081265 A1 | 4/2010 | Mashita et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |

FOREIGN PATENT DOCUMENTS

| | | |
|---|---|---|
| CN | 1761063 | 4/2006 |
| CN | 101026087 | 8/2007 |
| CN | 101145515 | 3/2008 |
| CN | 200980148546.9 | 11/2012 |
| CN | 200980148548.8 | 2/2013 |
| CN | 200980148590 | 2/2013 |
| CN | 201080013110.1 | 5/2013 |
| EP | 0171111 | 2/1986 |
| EP | 1273974 A2 | 1/2003 |
| EP | 09830819 | 3/2013 |
| EP | 10756541 | 5/2013 |
| EP | 09743197 | 6/2013 |
| EP | 09830818.2 | 7/2013 |
| JP | 56046531 | 4/1981 |
| JP | 58157135 | 9/1983 |
| JP | 59211231 | 11/1984 |
| JP | 64035916 | 3/1989 |
| JP | 1292829 | 11/1989 |
| JP | 3270227 | 12/1991 |
| JP | 1994077180 A | 3/1994 |
| JP | 6275577 | 9/1994 |
| JP | 2002217170 A | 8/2002 |
| JP | 2003234279 | 8/2003 |
| JP | 2004134574 | 4/2004 |
| JP | 2004247399 | 9/2004 |
| JP | 2005-243681 | 9/2005 |
| JP | 2007017993 | 1/2007 |
| JP | 2007-294511 | 11/2007 |
| JP | 2007305976 | 11/2007 |
| JP | 2008-072097 | 3/2008 |
| JP | 2008-072101 | 3/2008 |
| JP | 2009289974 | 12/2009 |
| KR | 20030049198 | 6/2003 |
| KR | 20030056601 | 7/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0039006 | 5/2008 |
| KR | 20080038963 | 5/2008 |
| TW | 098113229 | 9/2012 |
| TW | 098139941 | 12/2012 |
| TW | 098139943 | 12/2012 |
| WO | WO2007/027558 | 3/2007 |
| WO | 2008/008338 | 1/2008 |
| WO | PCT/US2007/015729 | 1/2008 |
| WO | 2008/059440 | 5/2008 |
| WO | PCT/US2009/039793 | 10/2009 |
| WO | PCT/US2009/041500 | 12/2009 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/063978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |

OTHER PUBLICATIONS

U.S. Appl. No. 12/125,725, filed May 22, 2008, deVilliers.
U.S. Appl. No. 12/328,435, filed Dec. 4, 2008, Sills et al.
U.S. Appl. No. 12/328,448, filed Dec. 4, 2008, Sills et al.
U.S. Appl. No. 12/328,464, filed Dec. 4, 2008, Sills et al.
U.S. Appl. No. 13/101,485, filed May 5, 2011, Light et al.
Clariant; Polysilazane SODs Spinful 400 Series for STI/PMD Application; At least as early as Oct. 19, 2009; 1 p.
Ee et al.; Innovative Solutions to Enhance the Legacy Equipments Towards "One Generation ahead" in Flip chip BGA 0.8mm Ball Pitch Technology; Sep. 2005; 4 pp.

(56) References Cited

OTHER PUBLICATIONS

Fritze et al., "Enhanced Resolution for Future Fabrication", IEEE Circuits & Devices Magazine, Jan. 2003, pp. 43-47.

Gallia et al.; A Flexible Gate Array Architecture for High-speed and High-Density Applications; Mar. 1996 pp. 430-436.

Hori et al., "Sub-40nm Half-Pitch Double Patterning with Resist Freezing Process", Proc. of SPIE vol. 6923 (2008) pp. 69230H-1 through 69230H-8.

Lee et al., "Double-Patterning Technique Using Plasma Treatment of Photoresist", Japanese Journal of applied Physics, vol. 46, No. 9B, 2007, pp. 6135-6139.

Liau et al., "Softbake and Post-exposure Bake Optimization for Process Window Improvement and Optical Proximity Effect Tuning", ICSE 2006 Proc. 2006, Kuala Lumpur, Malaysia, 7 pgs.

Lu; Advanced cell Structures for Dynamic RAMs; Jan. 1989; pp. 27-36.

Ma, "Plasma Resist Image Stabilization Technique (PRIST)", IEEE 1980, pp. 574-575.

Owa et al., "Immersion Lithography Ready for 45nm Manufacturing and Beyond", 2007 IEEE/SEMI Advanced Semiconductor Manufacturing Conference, pp. 238-244.

Pease et al., "Lithography and Other Patterning Techniques for Future Electronics", Proceedings of teh IEEE/vol. 96, No. 2, Feb. 2008, pp. 248-270.

Tan et al., "Current Status of Nanonex Nanoimprint Solutions", website: www.nanonex.com/technology,htm 2004, 9 pgs.

Terai et al., "Newly developed RELACS process and materials for 65nm node device and beyond", sebsite: ieeexplore.ieee.org/iel5/10631/33565/01595193.pdf, pp. 20-21.

\* cited by examiner

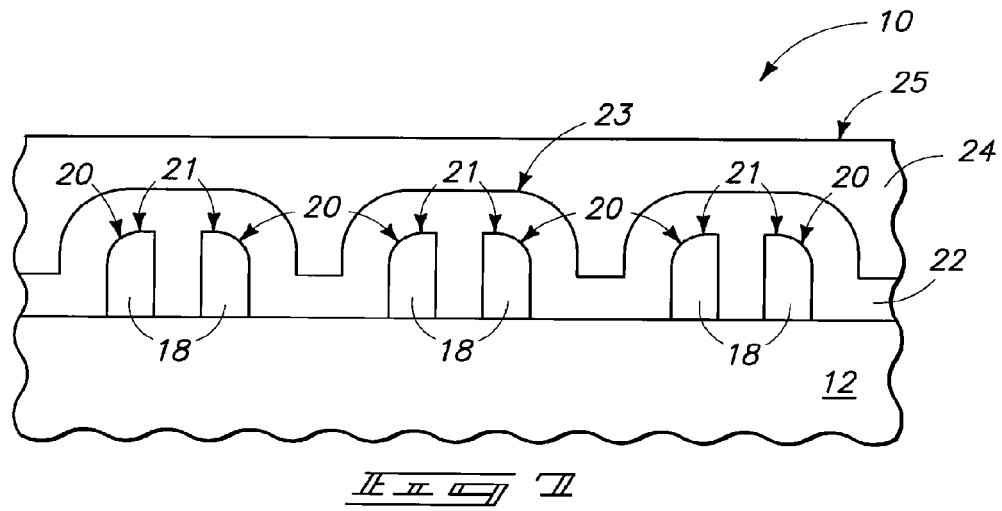
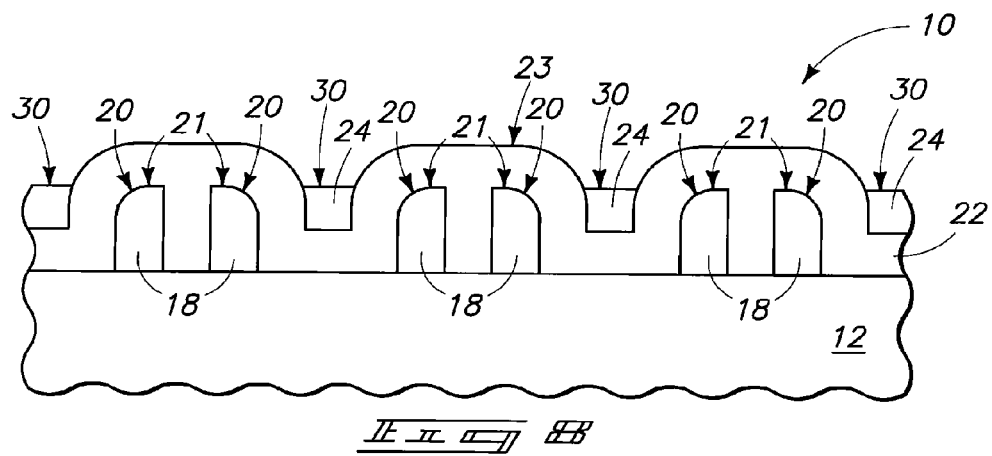
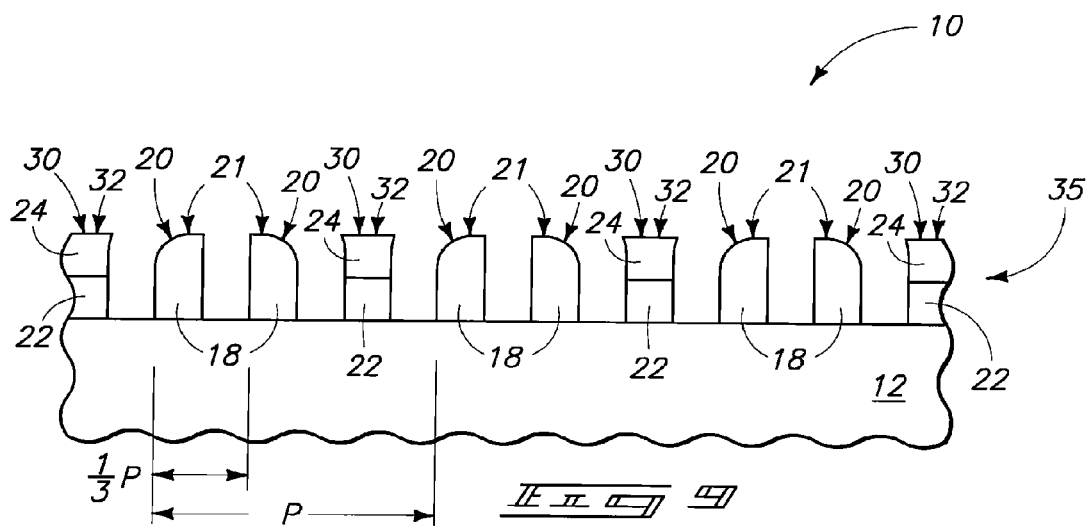

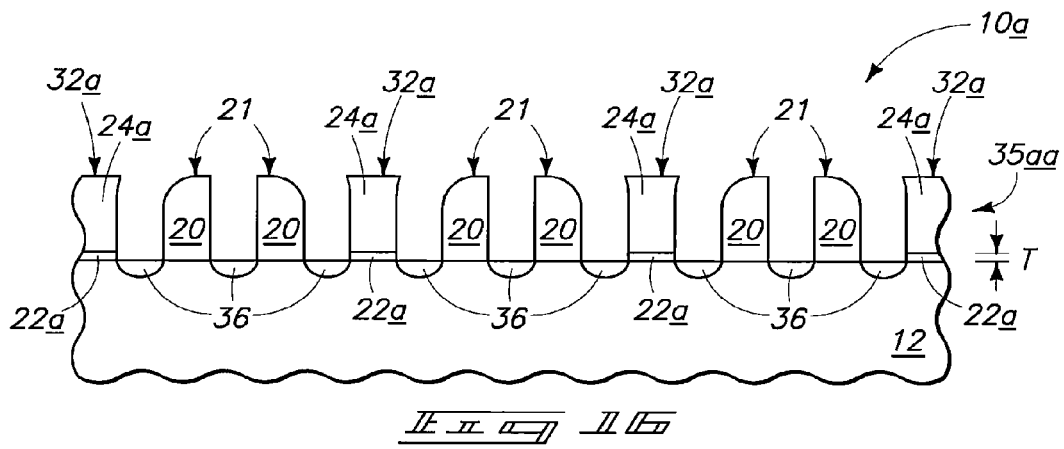
_FIG. 16_
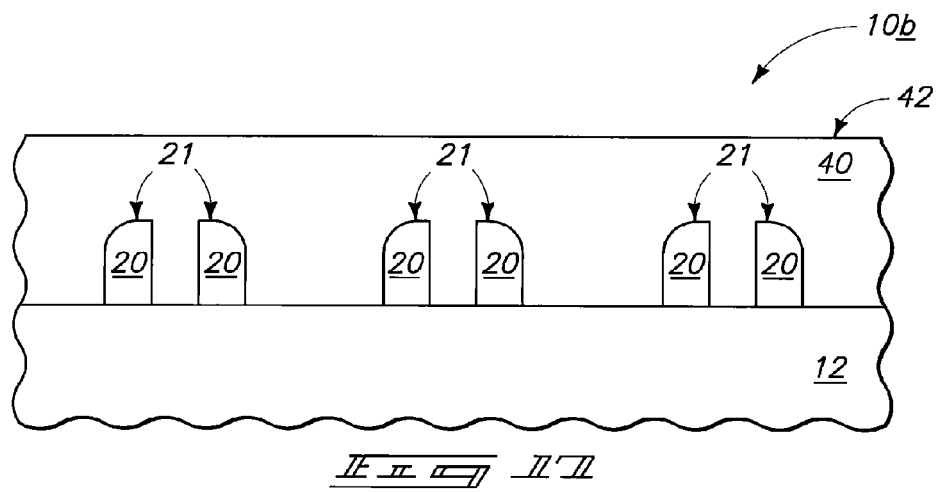
_FIG. 17_
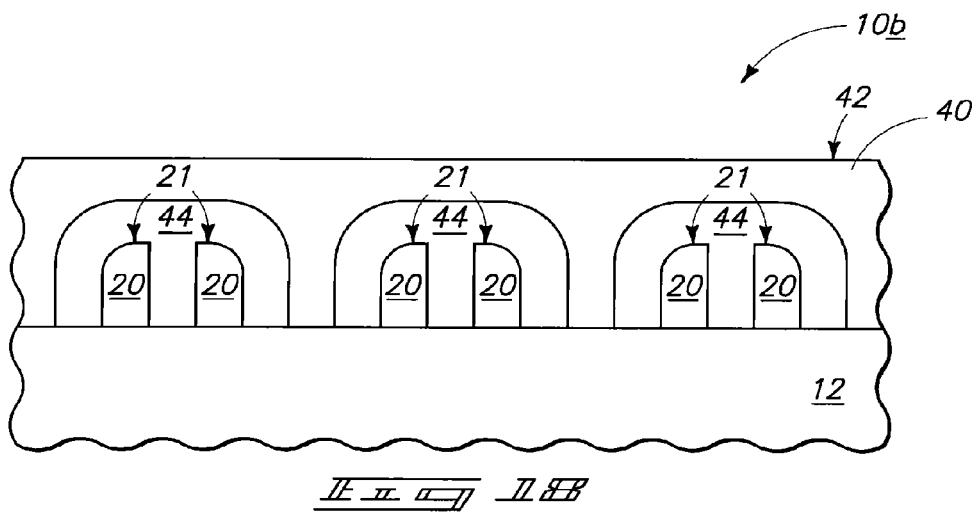
_FIG. 18_

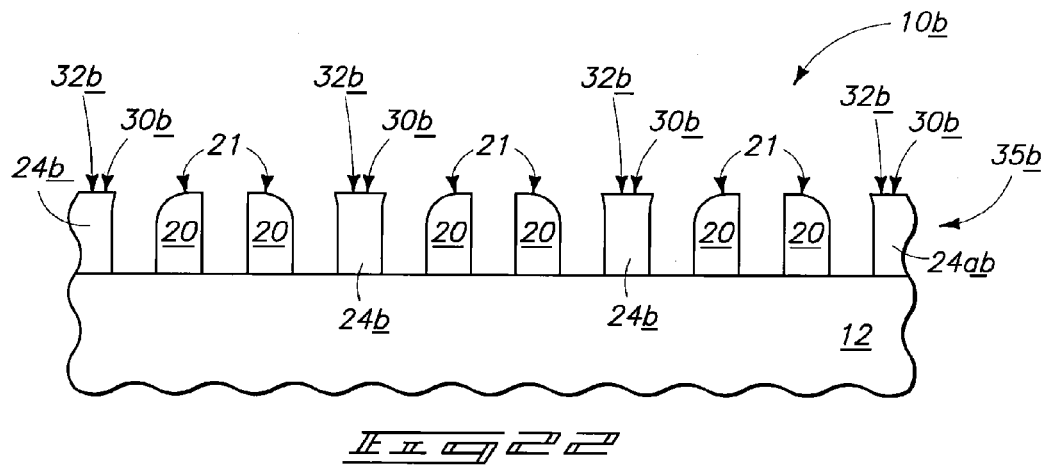
F I G 22
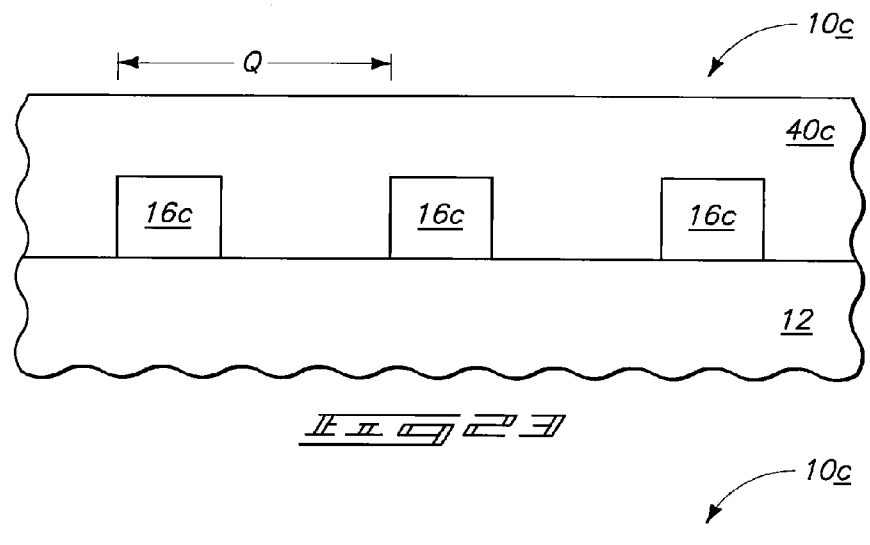
F I G 23
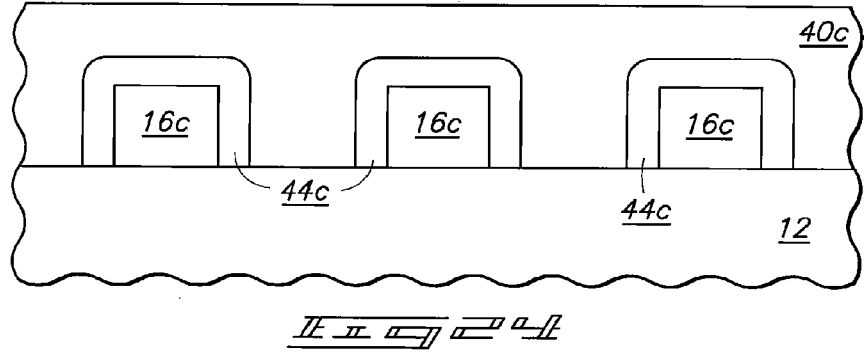
F I G 24

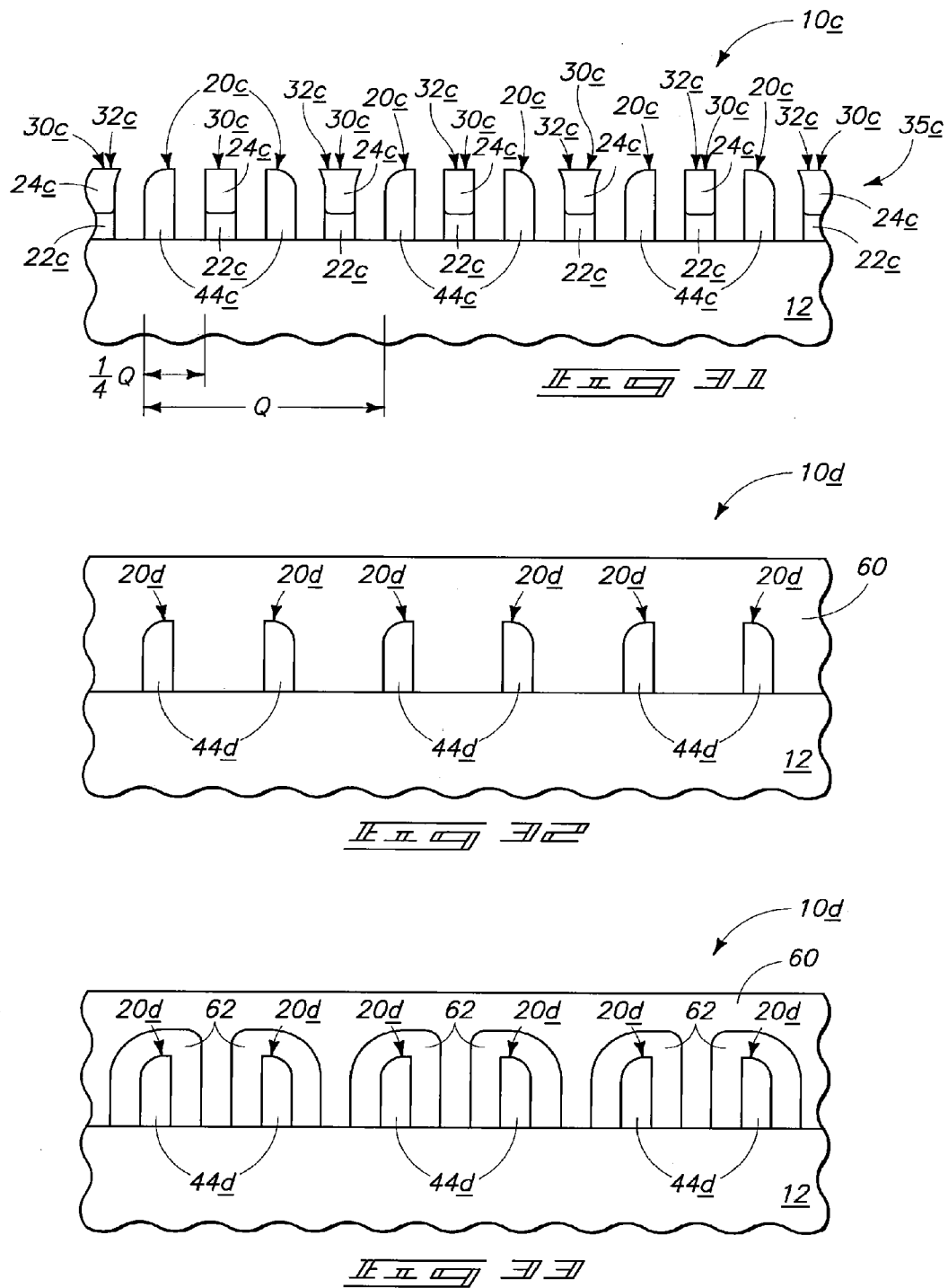

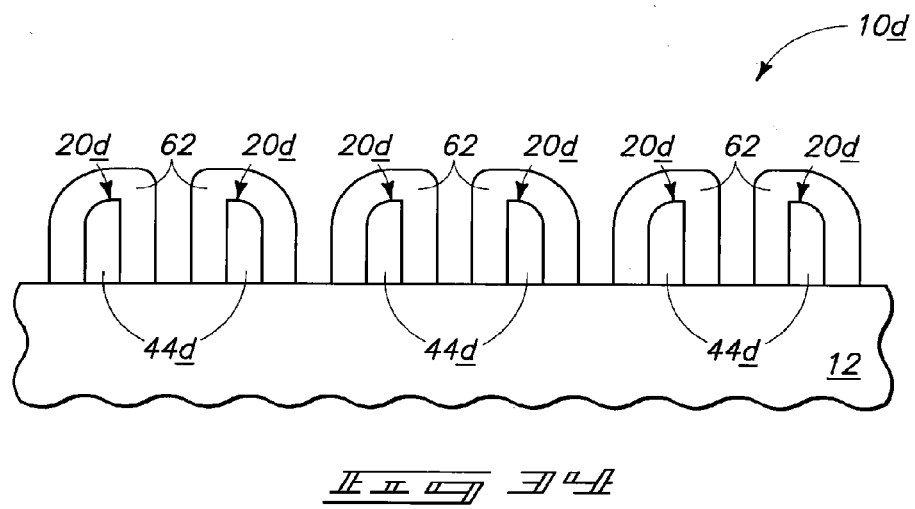
F I G 34
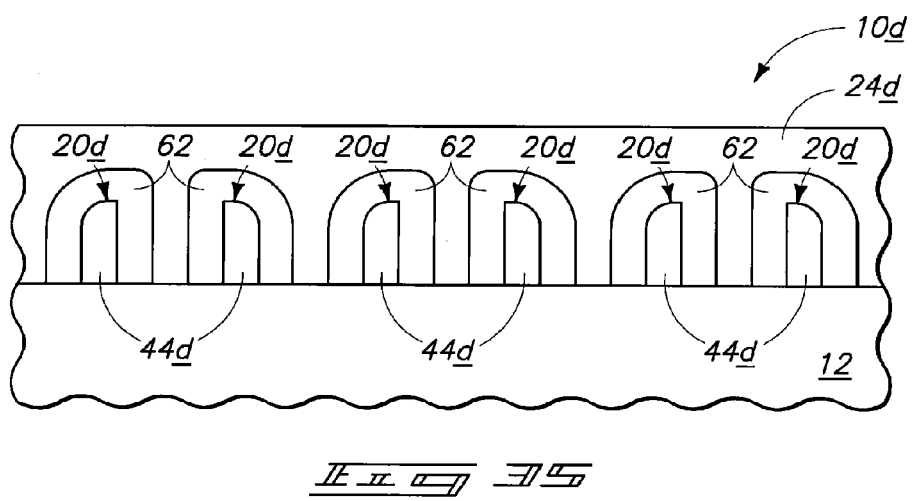
F I G 35

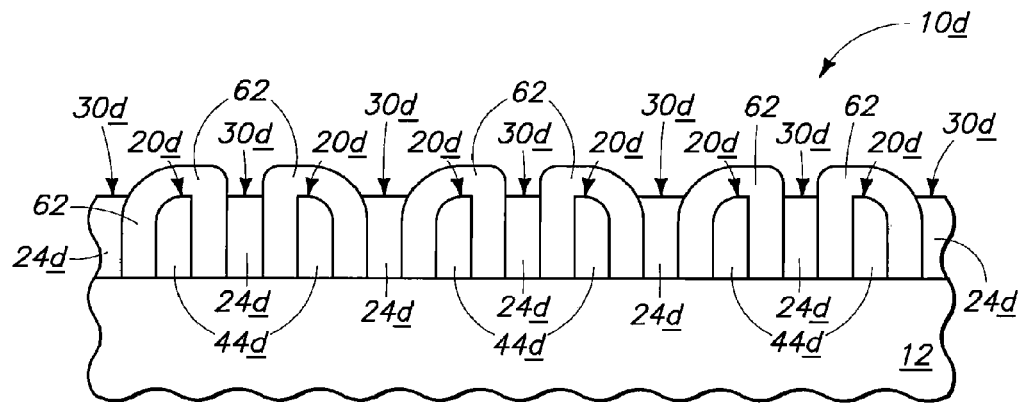
_FIG. 31G_
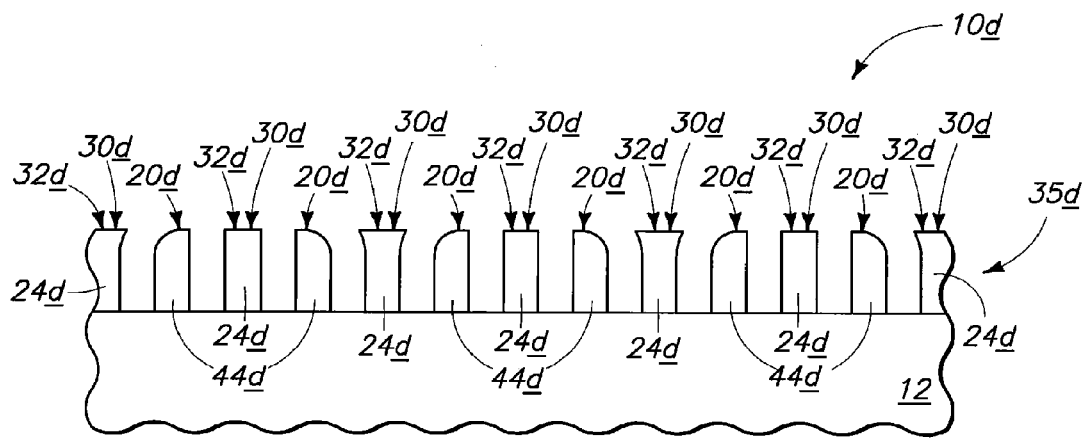
_FIG. 31H_

METHODS OF FABRICATING SUBSTRATES

RELATED PATENT DATA

This patent resulted from a continuation application of U.S. patent application Ser. No. 12/328,435, filed Dec. 4, 2008, entitled "Methods of Fabricating Substrates", naming Scott Sills, Gurtej S. Sandhu, and Anton deVilliers as inventors, the disclosure of which is incorporated by reference.

TECHNICAL FIELD

Embodiments disclosed herein pertain to methods of fabricating substrates, for example as may be used in the fabrication of integrated circuitry.

BACKGROUND

Integrated circuits are typically formed on a semiconductor substrate such as a silicon wafer or other semiconducting material. In general, layers of various materials which are either semiconducting, conducting or insulating are utilized to form the integrated circuits. By way of example, the various materials are doped, ion implanted, deposited, etched, grown, etc. using various processes. A continuing goal in semiconductor processing is to continue to strive to reduce the size of individual electronic components thereby enabling smaller and denser integrated circuitry.

One technique for patterning and processing semiconductor substrates is photolithography. Such includes deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, thereby leaving a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are utilized.

The continual reduction in feature sizes places ever greater demands on the techniques used to form the features. For example, photolithography is commonly used to form patterned features, such as conductive lines. A concept commonly referred to as "pitch" can be used to describe the sizes of the features in conjunction with spaces immediately adjacent thereto. Pitch may be defined as the distance between an identical point in two neighboring features of a repeating pattern in a straight line cross section, thereby including the maximum width of the feature and the space to the next immediately adjacent feature. However, due to factors such as optics and light or radiation wave length, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing spacer-forming layers to have a lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such technique where pitch is actually halved, such reduction in pitch is conventionally referred to as pitch "doubling". More generally, "pitch multiplication" encompasses increase in pitch of two or more times and also of fractional values other than integers. Thus, conventionally, "multiplication" of pitch by a certain factor actually involves reducing the pitch by that factor.

BRIEF DESCRIPTION OF THE DRAWINGS

FIG. 7 is a view of the FIG. 6 substrate at a processing step subsequent to that shown by FIG. 6.

FIG. 8 is a view of the FIG. 7 substrate at a processing step subsequent to that shown by FIG. 7.

FIG. 9 is a view of the FIG. 8 substrate at a processing step subsequent to that shown by FIG. 8.

FIG. 16 is a view of the FIG. 15 substrate at a processing step subsequent to that shown by FIG. 15.

FIG. 17 is a diagrammatic sectional view of another substrate in process in accordance with an embodiment of the invention.

FIG. 18 is a view of the FIG. 17 substrate at a processing step subsequent to that shown by FIG. 17.

FIG. 22 is a view of the FIG. 21 substrate at a processing step subsequent to that shown by FIG. 21.

FIG. 23 is a diagrammatic sectional view of another substrate in process in accordance with an embodiment of the invention.

FIG. 24 is a view of the FIG. 23 substrate at a processing step subsequent to that shown by FIG. 23.

FIG. 31 is a view of the FIG. 30 substrate at a processing step subsequent to that shown by FIG. 30.

FIG. 32 is a diagrammatic sectional view of another substrate in process in accordance with an embodiment of the invention.

FIG. 33 is a view of the FIG. 32 substrate at a processing step subsequent to that shown by FIG. 32.

FIG. 34 is a view of the FIG. 33 substrate at a processing step subsequent to that shown by FIG. 33.

FIG. 35 is a view of the FIG. 34 substrate at a processing step subsequent to that shown by FIG. 34.

FIG. 36 is a view of the FIG. 35 substrate at a processing step subsequent to that shown by FIG. 35.

FIG. 37 is a view of the FIG. 36 substrate at a processing step subsequent to that shown by FIG. 36.

DETAILED DESCRIPTION OF EXAMPLE EMBODIMENTS

Figure 1:
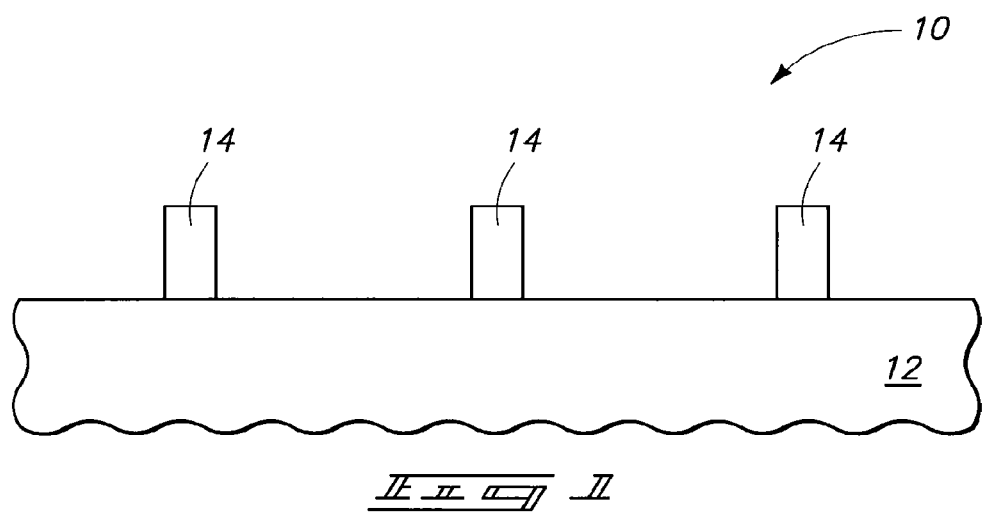
FIG. 1 is a diagrammatic sectional view of a substrate in process in accordance with an embodiment of the invention.

Some embodiments of methods of fabricating a substrate in accordance with the invention, for example in forming integrated circuitry, are described initially with reference to FIGS. 1-10. Referring to FIG. 1, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 is depicted as comprising material 12 which will ultimately be processed through a mask pattern formed thereover. Material 12 may be homogenous or non-homogenous, for example comprising multiple different composition regions and/or layers. Spaced first features 14 have been formed over substrate 12. Any suitable material is contemplated, and whether homogenous or non-homogenous. In the context of this document, "spaced" refers to the lateral direction as opposed to vertically or otherwise. Spaced first features 14 may be patterned/formed by any existing or yet-to-be-developed manner, with photolithographic patterning using photoresist (whether positive, negative or dual-tone resist resulting from single or multi-pattern lithography) being an example. Further, spaced first features 14 may be formed by any technique described below. In one example, spaced first features 14 may be in the form of elongated lines, for example running parallel one another over at least some portion of the substrate as would be viewed in a top-down view (not shown).

Figure 2:
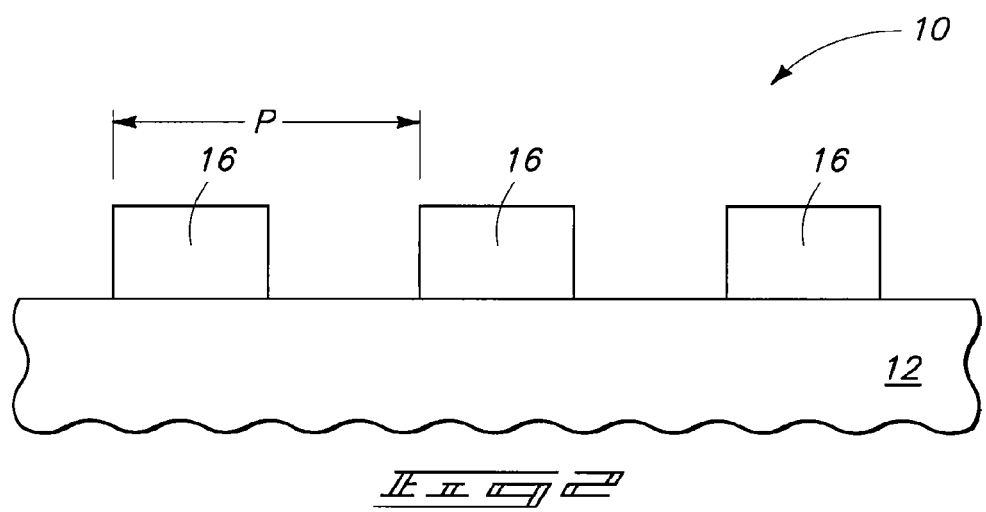
FIG. 2 is a view of the FIG. 1 substrate at a processing step prior to that of FIG. 1.

Further in one embodiment, spaced first features 14 may result from lateral etching/trimming of wider features. For example, FIG. 2 depicts substrate 10 at a processing step prior to that of FIG. 1. Such is shown as comprising spaced mask features 16, for example comprising, consisting essentially of, or consisting of photoresist, having been fabricated over substrate 12 in a repeating pattern of a pitch "P". Pitch P may be equal to, greater than, or less than the minimum photolithographic resolution with which substrate 10 is fabricated. Regardless, spaced mask features 16 of FIG. 2 have been laterally trimmed to reduce their respective widths to produce the example construction of FIG. 1 which comprises spaced first features 14. Such may be conducted by an isotropic etch which removes material approximately equally from the sides and tops of spaced mask features 16. Alternately, chemistries and conditions may be used which tend to etch greater material from the lateral sides of spaced mask features 16 than from the respective tops. Alternately, chemistries and conditions may be used which tend to etch greater material from the tops of spaced mask features 16 than from the lateral sides.

For example, the construction depicted by FIG. 1 can be derived by plasma etching the substrate of FIG. 2 within an inductively coupled reactor. Example etching parameters which will achieve essentially isotropic etching where material of spaced mask features 16 is photoresist and/or other organic-comprising material are pressure from about 2 mTorr to about 50 mTorr, substrate temperature from about 0° C. to about 110° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where material of spaced mask features 16 comprises photoresist, such will isotropically etch mask features 16 at a rate from about 0.2 nanometer per second to about 3 nanometers per second. While such an example etch is essentially isotropic, greater lateral etching of the spaced mask features will occur as two sides are laterally exposed as compared to only a single upper surface thereof.

If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm.

It may be desired that the stated etching provide greater removal from the top of the spaced mask features than from the sides, for example to either achieve equal elevation and width reduction or more elevation than width reduction. The example parameters for achieving greater etch rate in the vertical direction as opposed to the lateral direction include pressure from about 2 mTorr to about 20 mTorr, temperature from about 0° C. to about 100° C., source power from about 150 watts to about 300 watts, bias voltage at greater than or equal to about 200 volts, $Cl_2$ and/or HBr flow from about 20 sccm to about 100 sccm, and $O_2$ flow from about 10 sccm to about 20 sccm.

The example FIGS. 1 and 2 embodiments depict the respective features as having equal shapes and widths relative one another in the depicted cross section, as well as equal spacing therebetween. Such is not, however, required in this or other embodiments.

Figure 3:
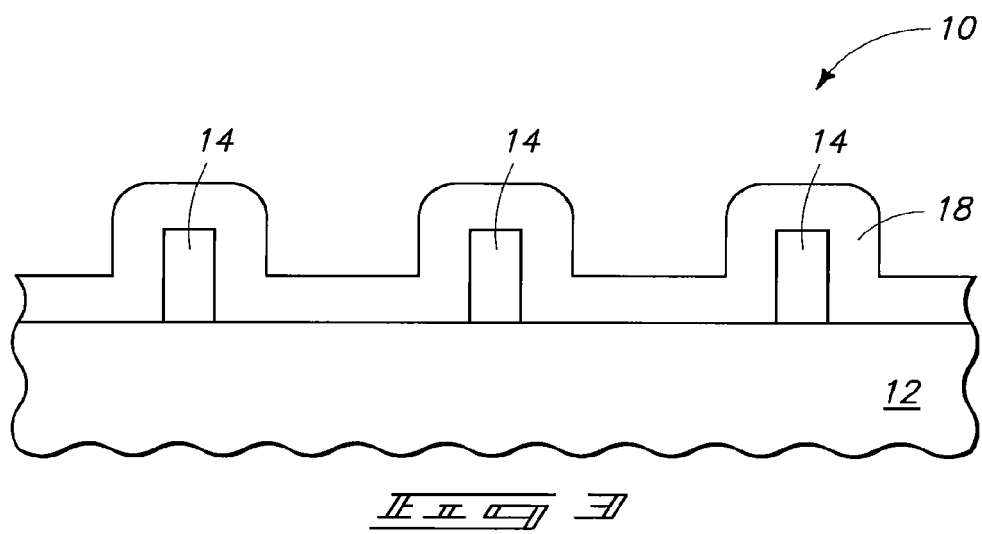
FIG. 3 is a view of the FIG. 1 substrate at a processing step subsequent to that shown by FIG. 1.
Figure 4:
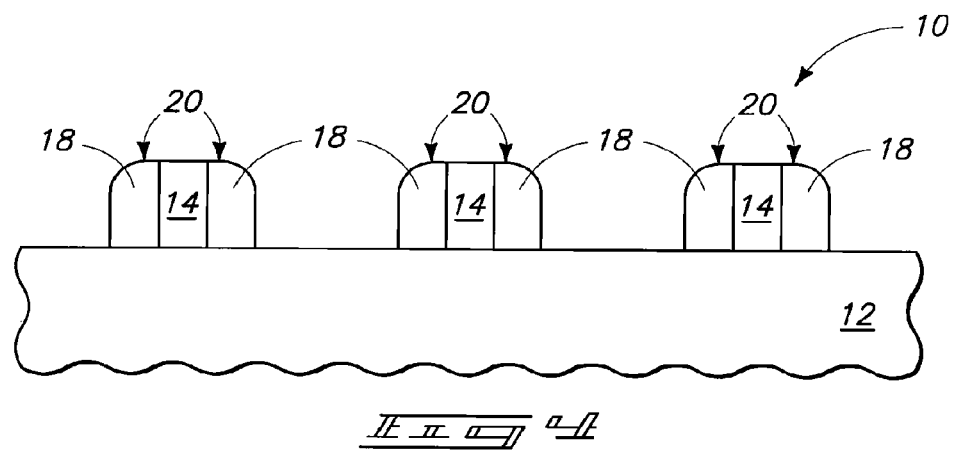
FIG. 4 is a view of the FIG. 3 substrate at a processing step subsequent to that shown by FIG. 3.

Referring to FIG. 3, a material 18 has been deposited as part of substrate 10, and from which anisotropically etched spacers will be formed. Such may be etchably different from the material of spaced first features 14, and may be conductive, semiconductive or insulative, including any combination thereof. Examples include silicon dioxide, silicon nitride, organic antireflective coatings, inorganic antireflective coatings, polysilicon, titanium or titanium nitride, including any combination thereof. Referring to FIG. 4, material 18 has been anisotropically etched to form spacers 20 on sidewalls of spaced first features 14.

Figure 5:
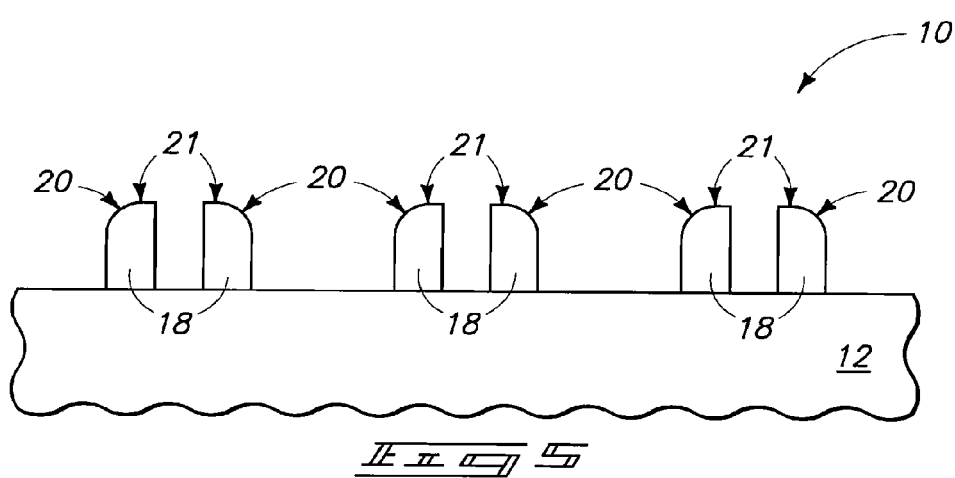
FIG. 5 is a view of the FIG. 4 substrate at a processing step subsequent to that shown by FIG. 4.

Referring to FIG. 5, spaced first features 14 (not shown) have been removed from substrate 10 to form spaced second features which comprise spacers 20. Where, for example, the material of spaced first features 14 comprised photoresist and/or other organic material, $O_2$ plasma etching will remove material 14 from between spacers 20. Regardless, the removal of material 14 may or may not etch some of spacers 20, with negligible such removal being shown in FIG. 5 to form spaced second features 20. FIGS. 1 and 4 depict one example embodiment wherein first features 14 are equally spaced from each adjacent of the first features (FIG. 1), and second features 20 are not equally spaced from each adjacent of the second features. Alternate embodiments are contemplated. For example and by way of example only, first features 14 may be equally spaced from each adjacent of the first features and second features 20 may be equally spaced from each adjacent of the second features. For purposes of the continuing discussion, FIG. 5 depicts respective closest pairs 21 of two immediately adjacent of second features 20 having a respective space between each two of a pair 21.

Figure 6:
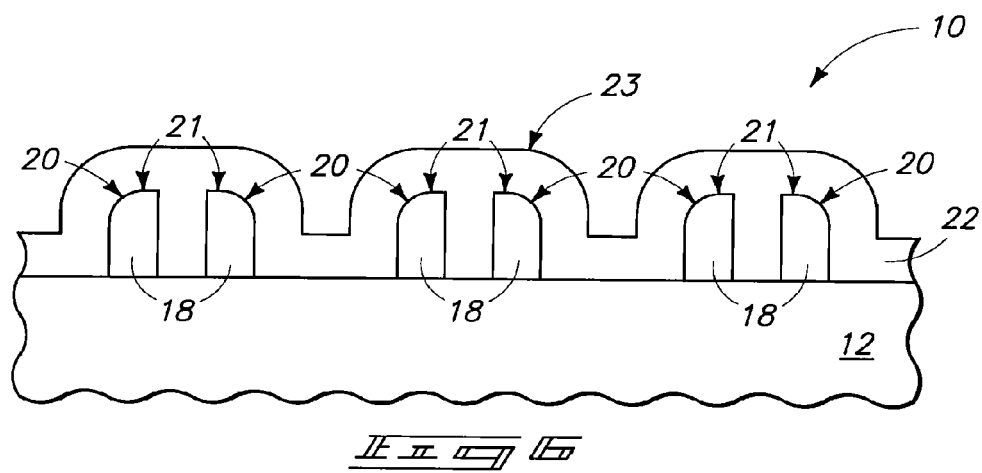
FIG. 6 is a view of the FIG. 5 substrate at a processing step subsequent to that shown by FIG. 5.

Referring to FIG. 6, a first material 22 has been deposited over spaced second features 20, and may be of some different composition from that of spaced second features 20. Material 22 may or may not be homogenous. Example materials include any of those described above for spacer-forming material 18. In the FIG. 6 embodiment, first material 22 has a non-planar outermost surface 23, and has been deposited to completely fill space between closest pairs 21 of two immediately adjacent of second features 20.

Referring to FIG. 7, a second material 24 has been deposited over first material 23, and is of some different composition from that of first material 22 and from that of spaced second features 20. Second material 24 has a planar outermost surface 25. Such may, for example, result from the inherent deposition of material 24 in a liquid-fill manner, or from deposition of one or more conformal layers followed by some sort of polish-back or etch-back thereof. Example second materials 24 include photoresist and other polymers, for example polystyrene, polymethylmethacrylate and polysiloxane. Material 24 may or may not be homogenous.

Referring to FIG. 8, only a portion of second material 24 has been removed to expose first material 22 and form regions of spaced second material 30 received over first material 22. Any suitable etching technique and conditions can be selected by the artisan. Some of material 22 may or may not be etched during the processing to produce the construction of FIG. 8.

Referring to FIG. 9, first material 22 has been etched from between spaced second material 30 and spaced third features 32 have been formed which comprise spaced second material 30 received over first material 22. Third features 32 are spaced from second features 20. Any suitable substantially anisotropic etching chemistry and conditions can be selected by the artisan for producing the FIG. 9 construction. FIG. 9 depicts one example embodiment where a mask pattern 35 has been formed over substrate 12 and which comprises spaced second features 20 and spaced third features 32. Such also depicts an example embodiment wherein pairs 21 of immediately adjacent spaced second features 20 alternate with individual of spaced third features 32.

The above processing may be conducted, for example, to result in a pitch multiplication which may or may not be sub-lithographic. Regardless, the FIGS. 1-9 embodiments depict mask pattern 35 (FIG. 9) having been formed to have a pitch which is one-third (an integer factor of 3) that of pitch "P" of spaced mask features 16 in FIG. 2. Any degree of pitch reduction (including non-integer fractional reduction) in FIGS. 1-9, or otherwise, will of course be in large part determined on the degree of any lateral trimming that may occur of spaced features (for example in forming the substrate of FIG. 2 from that of FIG. 1) in combination with thickness of the deposited layers to produce the features and the spaces between features. For example, the deposition thickness of material 18 in FIG. 3 in combination with the etching technique to produce FIG. 4 impacts the width of spaced second features 20. Similarly, the deposition thickness of first material 22 in significant part determines spacing between second features 20 and third features 32. Further and regardless, some or all of spaced second features 20 and/or spaced third features 32 may be further laterally trimmed after forming the FIG. 9 construction. Further by way of example, spaced second features 20 of FIG. 4 and/or FIG. 5 may be laterally trimmed.

Figure 10:
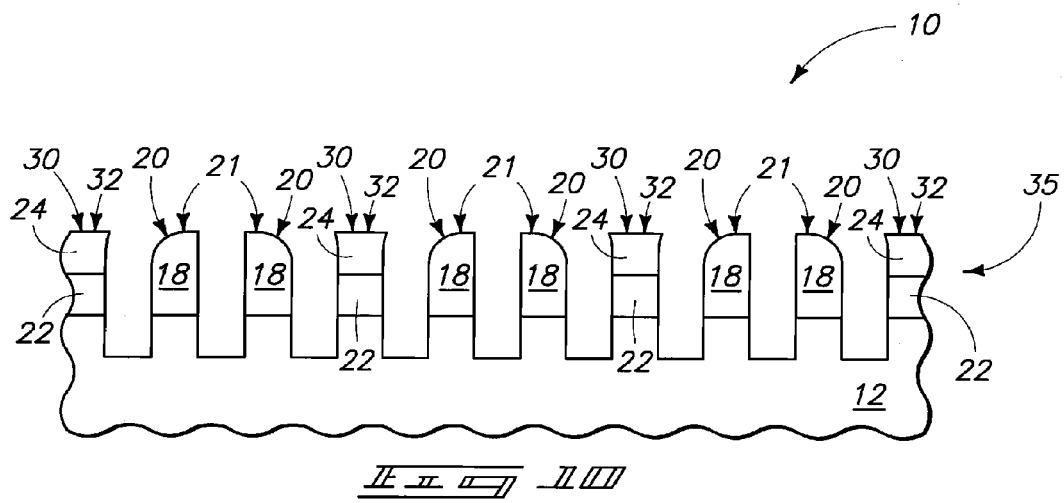
FIG. 10 is a view of the FIG. 9 substrate at a processing step subsequent to that shown by FIG. 9.

The mask pattern comprising the spaced second features and the spaced third features is used to process the substrate received elevationally there-below through such mask pattern. Such processing may constitute any existing or yet-to-be developed technique, with etching and/or ion implanting being specific examples. FIG. 10 depicts one example with such processing wherein mask pattern 35 has been used as an etch mask while etching into material 12 of substrate 10.

Figure 11:
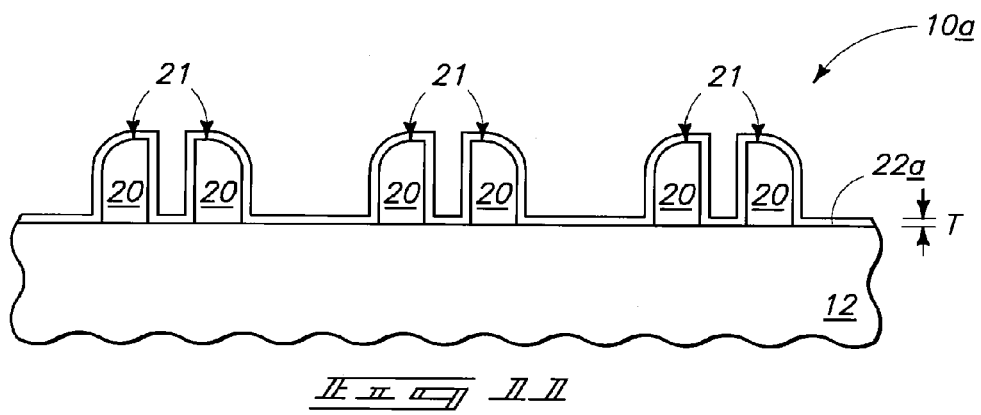
FIG. 11 is a diagrammatic sectional view of another substrate in process in accordance with an embodiment of the invention.

Additional embodiments are next described with reference to FIGS. 11-16. FIG. 11 depicts an alternate embodiment substrate fragment 10a corresponding in processing sequence to that of FIG. 6. Like numerals from the first described embodiments have been utilized where appropriate, with construction differences being indicated with the suffix "a" or with different numerals. While the suffix "a" indicates different construction, example material for such constructions is the same as used in the above embodiments for the same numerals without the suffix "a". In FIG. 11, first material 22a has been deposited much thinner than that depicted by deposition of material 22 in FIG. 6 to less than completely fill space between closest pairs 21 of two immediately adjacent of second features 20.

Figure 12:
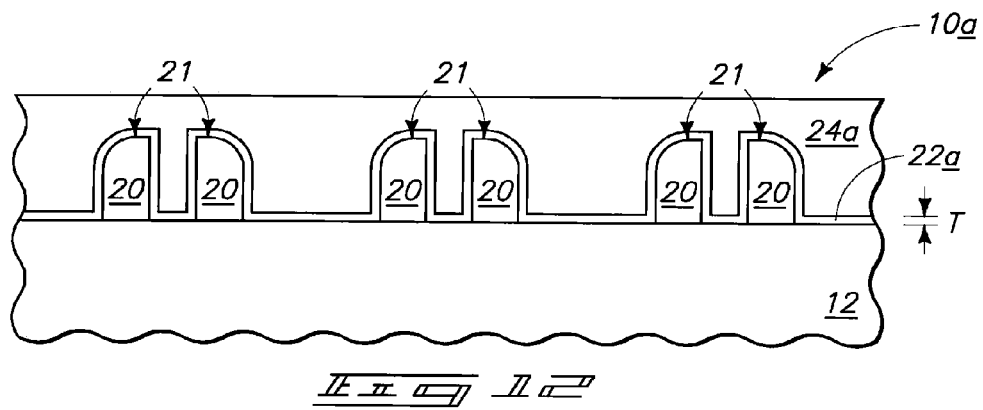
FIG. 12 is a view of the FIG. 11 substrate at a processing step subsequent to that shown by FIG. 11.

Referring to FIG. 12, second material 24a has been formed over first material 22a. FIGS. 11 and 12 depict one embodiment wherein first material 22a has been deposited to a minimum thickness T which is less than that of second material 24 and less than maximum width of spaced second features 20.

Figure 13:
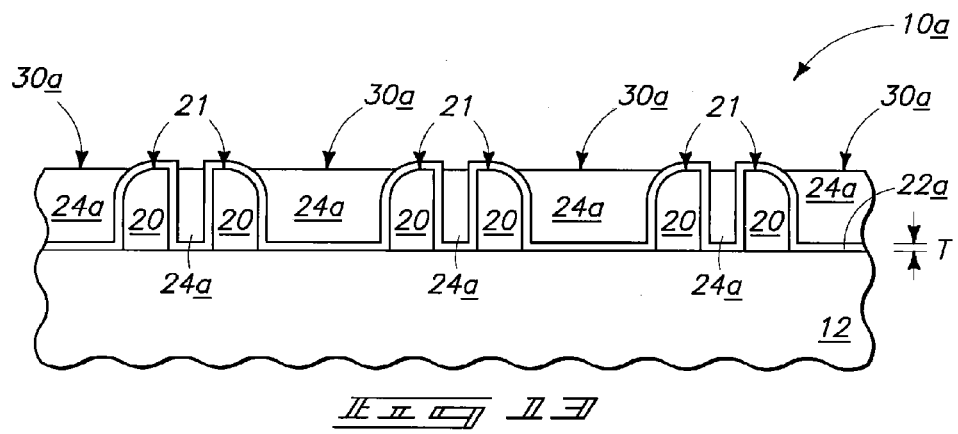
FIG. 13 is a view of the FIG. 12 substrate at a processing step subsequent to that shown by FIG. 12.

Referring to FIG. 13, only a portion of second material 24a has been removed to expose first material 22a and form spaced second material 30a received over first material 22a.

Figure 14:
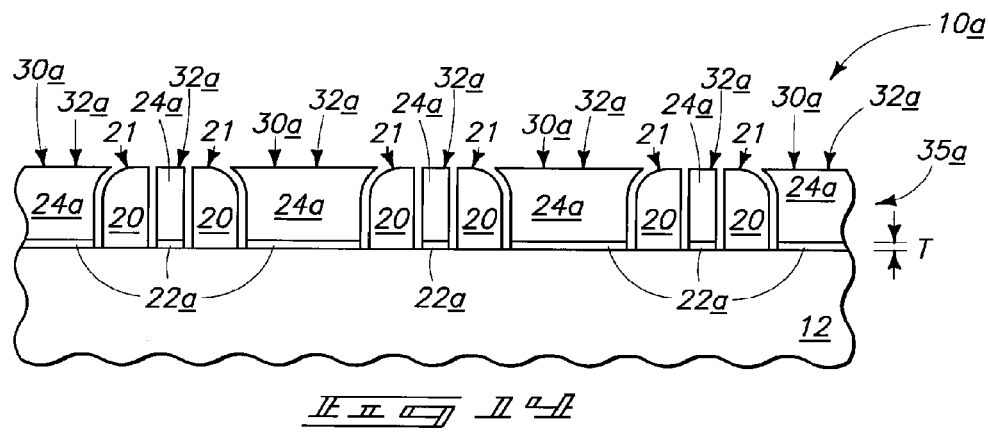
FIG. 14 is a view of the FIG. 13 substrate at a processing step subsequent to that shown by FIG. 13.

Referring to FIG. 14, first material 22a has been etched from between spaced second material 30a and third spaced features 32a have been formed which comprise spaced second material 30a received over first material 22a. Third features 32a are spaced from second features 20. Accordingly, FIG. 14 depicts an example mask pattern 35a having one of third features 32a received between each of adjacent of second features 20. Substrate 12 may be processed through the mask pattern 35a of FIG. 14 which comprises spaced second features 20 and spaced third features 32a, for example by etching, ion implanting, and/or other processes as described above. In FIG. 14, spaced third features 32a in mask pattern 35a are not of the same size/shape.

Figure 15:
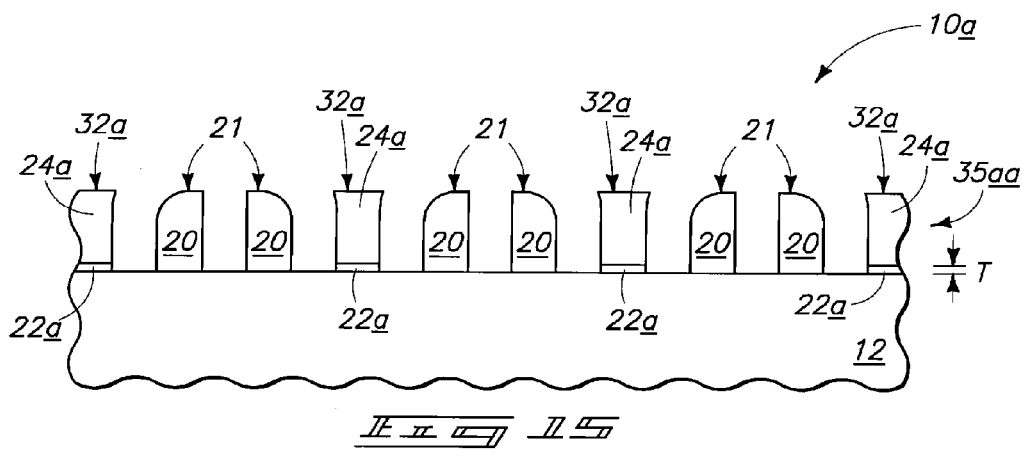
FIG. 15 is a view of the FIG. 14 substrate at a processing step subsequent to that shown by FIG. 14.

FIG. 15 depicts additional processing of substrate 10a to produce a mask pattern 35aa. Such may be formed by laterally trimming width of third features 32a after the etching of first material 22a of FIG. 14. In one embodiment after forming the third features, all of only some of the third features may be removed to form the mask pattern prior to processing substrate material there-below. For example, FIG. 15 depicts lateral trimming the third features 32a which are received between the furthest spaced of second features 20 which has also resulted in complete removal of third features 32a which were received between closest pairs 21 of adjacent second features 20.

Referring to FIG. 16, substrate 10a has been processed through mask pattern 35aa. The example processing depicted in FIG. 16 is that of ion implantation, forming implanted regions 36.

An embodiment of the invention encompasses a method of fabricating a substrate which includes forming first and second spaced features over a substrate. For example, features 32a in FIG. 14 may be considered as spaced first features, and features 20 in FIG. 14 may be considered as spaced second features. The first spaced features have elevationally outermost regions which are different in composition from elevationally outermost regions of the second spaced features. The first and second spaced features alternate with one another. By way of example only, FIG. 14 depicts such a construction where spaced features 32a are considered as first spaced features and spaced features 20 are considered as second spaced features. Regardless, the second features may or may not be homogenous. In one embodiment, the first features comprise a second material received over a different composition first material. In one embodiment, the second features are of a composition which is different from that of the first and second materials.

In one embodiment, every other first feature is removed from the substrate and pairs of immediately adjacent second features are formed which alternate with individual of remaining of the first features. By way of example only, FIG. 15 depicts such an embodiment, wherein pairs 21 of immediately adjacent second features 20 alternate with individual of remaining of features 32a. In one embodiment, the removing comprises etching. For example, the processing in producing a substrate such as shown in FIG. 15 may occur by laterally etching the first and second materials selectively relative to second features 20 to remove every other first feature 32a from substrate 10a. Such has also reduced width of remaining of features 32a, thereby forming pairs 21 of immediately adjacent second features 20 which alternate with individual of the remaining of features 32a. Chemistries and conditions can be selected by the artisan to achieve such etching, with the above-described examples in producing the substrate of FIG. 1 from that of FIG. 2 being but examples. In one embodiment where for example the act of removing is by etching, no etch mask is received over features 32a during the act of etching. In one embodiment, no etch mask is received anywhere over the substrate during such etching.

After the removing of every other first feature from the substrate, the substrate is processed through a mask pattern comprising the pairs of immediately adjacent second features which alternate with individual of the remaining of the first features. By way of example only, FIG. 16 depicts such example processing with respect to a mask pattern 35aa.

Additional embodiments of methods of fabricating a substrate are next described with reference to FIGS. 17-22 with respect to a substrate fragment 10b. Like numerals with respect to the above-described embodiments are utilized where appropriate, with differences in construction being indicated with the suffix "b" or with different numerals. While the suffix "b" indicates different construction, example material for such constructions is the same as used in the above embodiments for the same numerals without the suffix "b". FIG. 17 depicts alternate processing to that of FIGS. 6 and 11 above, and wherein an alterable material 40 has been formed over spaced second features 20. Alterable material 40 interacts selectively or uniformly with certain materials with which it forms an interface. Alterable material 40 may be cast onto a pre-patterned surface (for example as shown) and may be conformal or non-conformal. Casting via spin-casting, dip-casting, drop-casting, or similar, are examples. The alterable material will be altered with material from the spaced second features to form altered material on sidewalls of the spaced second features. The altered material may form spontaneously upon deposition of the alterable material, or be subsequently activated, for example via thermal, photonic, electronic, ionic (including acid-based chemistry) treatments, by way of examples only. Accordingly, the altering may occur during deposition and/or after deposition. In one embodiment, no altering occurs until after completion of the deposition of the alterable material. Further, the altering may be self-limiting in the case of a limiting reagent or equilibrium conditions, or kinetically arrested if reactants are in excess. Alterable material 40 may have a planar outermost surface or a non-planar outermost surface, with an example planar outermost surface 42 being depicted in FIG. 17. Alterable material 40 may or may not be homogenous.

Material 40 may be similar to a class of materials available from Clariant International, Ltd. as so-called "AZ R" materials, such as the materials designated as AZ R200™, AZ R500™ and AZ R600™. The "AZ R" materials contain organic compositions which cross-link upon exposure to acid released from chemically-amplified resist. Accordingly for example, such materials constitute an example alterable material where material of spaced second features 20 comprises chemically-amplified resist. More specifically, an "AZ R" material may be coated across photoresist, and subsequently the resist may be baked at a temperature of from about 100° C. to about 120° C. to diffuse acid from the resist into the alterable material to form chemical cross-links within regions of the alterable material proximate the resist. Portions of the material adjacent the resist are thus selectively hardened relative to other portions of material that are not sufficiently proximate the resist. The material may then be exposed to conditions which selectively remove the non-hardened portions relative to the hardened portions. Such removal may be accomplished utilizing, for example, 10% isopropyl alcohol in deionized water, or a solution marketed as "SOLUTION C™" by Clariant International, Ltd. Processes utilizing the "AZ R" materials are sometimes considered examples of RELACS (Resolution Enhancement Lithography Assisted by Chemical Shrink) processes.

A challenge with the "AZ R" materials is that they can be similar enough in composition to photoresist that it may be difficult to selectively remove photoresist relative to hardened "AZ R" materials. In one embodiment, alterable material 40 may be similar to the "AZ R" materials in that it may comprise a similar or identical organic composition which is altered (for instance, forms cross-links) upon exposure to one or more substances (for instance, acid) released from material 20 over which material 40 lies when the substrate is baked. However, unlike "AZ R" materials, material 40 may also contain one or more components disbursed in the organic composition which are provided to chemically change material 40 relative to material of features 20 (for example, photoresist in embodiments where material of features 20 may be selectively removed relative to material 40). Components which may be disbursed in an organic composition of a material 40 may include one or more of titanium, carbon, fluorine, bromine, silicon and germanium. Any carbon disbursed in the organic composition may be part of a carbide compound so it is chemically different from bulk carbon of the organic composition. Any fluorine and/or bromine may be, for example, comprised of hydrofluoric acid and hydrobromic acid. In some embodiments, the components disbursed in an organic composition of a material 40 include one or more inorganic components, such as, for example, silicon, germanium, metals (for instance, titanium, tungsten, platinum, etc.) and/or metal-containing compounds (for instance, metal nitride, metal silicide, etc.). The component of material 40 that is similar to "AZ R" materials may be referred to as an "AZ R"-type composition. Accordingly, in some embodiments, alterable material 40 may be considered to have one or more inorganic components disbursed in an organic "AZ R"-type composition. However, alterable material 40 may comprise other than organic and other than "AZ R"-type compositions, for example as explained below.

A challenge with the "AZ R" materials is that they can be similar enough in composition to photoresist that it may be difficult to selectively remove photoresist relative to hardened "AZ R" materials. In one embodiment, alterable material 40 may be similar to the "AZ R" materials in that it may comprise a similar or identical organic composition which is altered (for instance, forms cross-links) upon exposure to one or more substances (for instance, acid) released from material 20 over which material 40 lies when the substrate is baked. However, unlike "AZ R" materials, material 40 may also contain one or more components dispersed in the organic composition which are provided to chemically change material 40 relative to material of features 20 (for example, photoresist in embodiments where material of features 20 may be selectively removed relative to material 40). Components which may be dispersed in an organic composition of a material 40 may include one or more of titanium, carbon, fluorine, bromine, silicon and germanium. Any carbon dispersed in the organic composition may be part of a carbide compound so it is chemically different from bulk carbon of the organic composition. Any fluorine and/or bromine may be, for example, comprised of hydrofluoric acid and hydrobromic acid. In some embodiments, the components dispersed in an organic composition of a material 40 include one or more inorganic components, such as, for example, silicon, germanium, metals (for instance, titanium, tungsten, platinum, etc.) and/or metal-containing compounds (for instance, metal nitride, metal silicide, etc.). The component of material 40 that is similar to "AZ R" materials may be referred to as an "AZ R"-type composition. Accordingly, in some embodiments, alterable material 40 may be considered to have one or more inorganic components dispersed in an organic "AZ R"-type composition. However, alterable material 40 may comprise other than organic and other than "AZ R"-type compositions, for example as explained below.

Referring to FIG. 18, substrate 10b has been subjected to conditions which cause inter-diffusion of materials 20 and 40 proximate spaced second features 20. Some substance of material 20 alters material 40 to form altered material 44 proximate spaced second features 20. Accordingly, the alterable material is capable of being altered with material from the spaced second features to form altered material on sidewalls of the spaced second features, for example as shown in FIG. 18. In one embodiment, the altering alters a portion of the alterable material 40 adjacent each of spaced second features 20 to form altered material 44 while leaving portions of the alterable material distal from spaced second features unaltered. FIG. 18 also depicts an embodiment wherein altered material 44 has been formed elevationally over spaced second features 20. Altered material 44 may or may not be homogenous.

In some embodiments, material of spaced second features 20 comprises chemically-amplified photoresist, and the substance from such photoresist which imparts the altering of material 40 is acid. The acid may be caused to be released from photoresist by baking semiconductor substrate 10b at a temperature of at least about 100° C. The acid forms cross-links with "AZ R"-type composition of material 40. The amount of cross-linking, and the distance that the cross-linking spreads from spaced features 20 may be adjusted by modifying one or both of bake time and bake temperature.

As an additional example where spaced features 20 comprise silicon, an example alterable material 40 is a refractory metal, such as titanium, to result in a reaction ultimately to form the altered material to comprise a metal silicide. Such by way of example only is shown and described in U.S. Patent Application Publication No. US2007/0049030. Additional alterable materials depending at least in part upon the composition of the spaced second features are also of course contemplated, and whether existing or yet-to-be developed.

Figure 19:
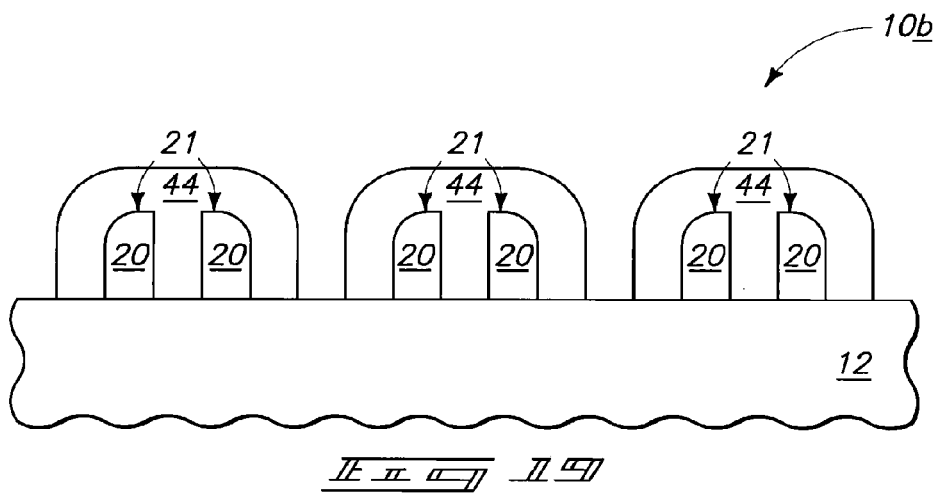
FIG. 19 is a view of the FIG. 18 substrate at a processing step subsequent to that shown by FIG. 18.

Referring to FIG. 19, and in one embodiment, un-reacted distal portions of material 40 (not shown) which were not altered to form material 44 have been removed, for example by etching, selectively relative to altered material 44. Suitable chemistries and conditions may be selected by the artisan depending upon composition of materials 40, 44 and 12. For example with respect to the "AZ R"-type compositions referred to above, such removal may be accomplished utilizing isopropyl alcohol and/or SOLUTION C™ as discussed above. Where material 40 may comprise additional components dispersed in an "AZ R"-type composition, such components may simply rinse away as the non-altered regions of material 40 are removed. Alternately, such additional components may be removed with solvents which remove the additional components. For instance, if silicon dioxide is utilized as a component of material 40, hydrofluoric acid may be utilized during removal of the non-altered regions of material 40 to ensure that the silicon dioxide of the non-altered regions is removed in addition to the "AZ R"-type composition of the non-altered regions.

Figure 20:
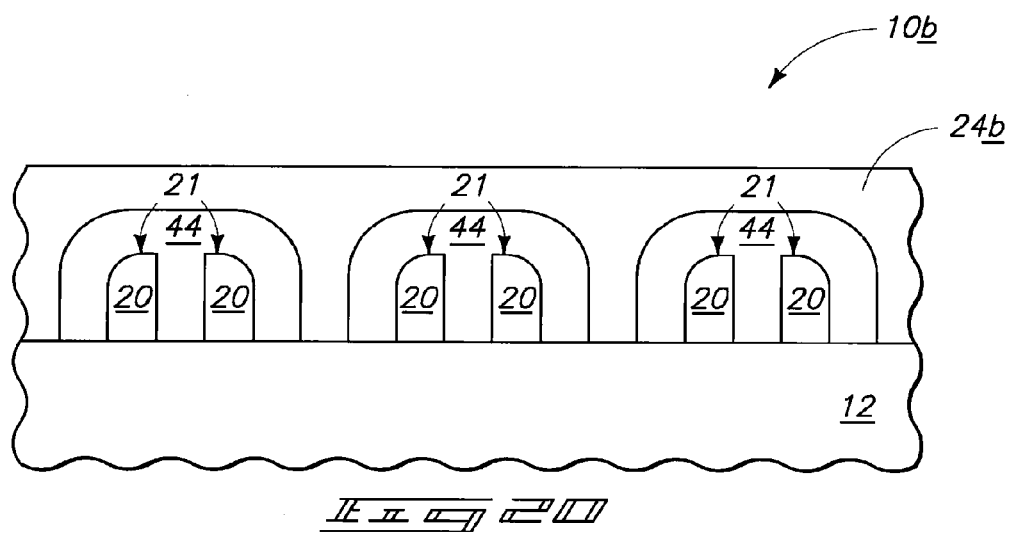
FIG. 20 is a view of the FIG. 19 substrate at a processing step subsequent to that shown by FIG. 19.

Referring to FIG. 20, second material 24b has been deposited over altered material 44, with second material 24b being of some different composition from that of altered material 44 and from that of spaced second features 20.

Figure 21:
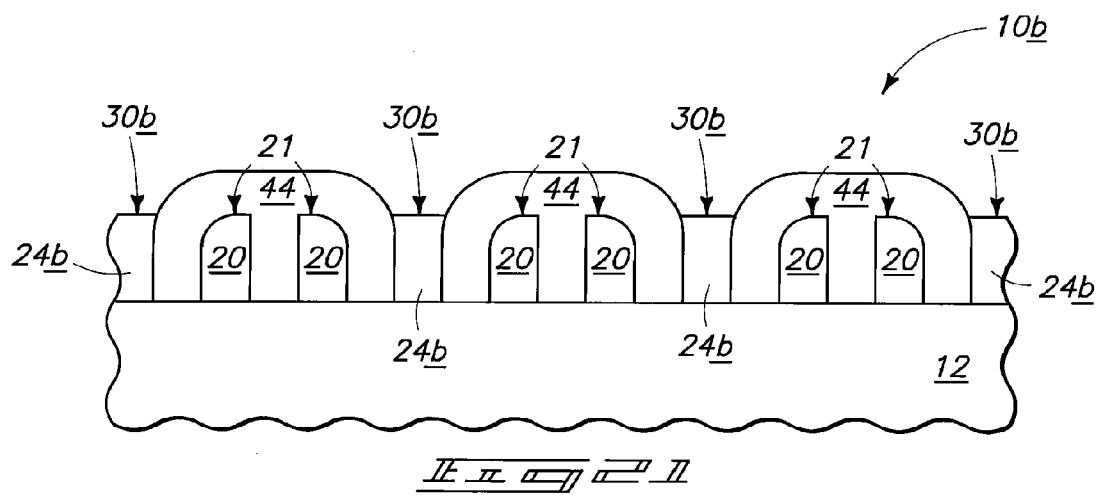
FIG. 21 is a view of the FIG. 20 substrate at a processing step subsequent to that shown by FIG. 20.

Referring to FIG. 21, only a portion of second material 24b has been removed to expose altered material 44 and form spaced second material 30b.

Referring to FIG. 22, altered material 44 (not shown) has been etched from between spaced second material 30b and spaced third features 32b have been formed which comprise spaced second material 30b. Third features 32b are spaced from second features 20. FIG. 22 depicts a mask pattern 35b which is used to process substrate 12 there-through, for example by etching and/or ion implanting and/or other processing, whether existing or yet-to-be developed.

Alternate embodiments to that depicted by FIGS. 19-21 are also contemplated. For example, material 40 of FIG. 18 might be processed such that only a portion thereof is removed to expose altered material 44 and form spaced alterable material as opposed to deposition of material 24b and removing a portion thereof. For example, material 40 of FIG. 18 could be removed to directly produce the construction of FIG. 21 wherein material 24b is substituted by material 40. After forming such spaced alterable material, altered material 44 would be etched from between the spaced alterable material and third features would be formed which comprise the spaced alterable material, with the third features being spaced from the second features. For example, the construction of FIG. 22 could be formed wherein material 24b is substituted by spaced alterable material 40 after material 44 of FIG. 21 has been removed.

Additional embodiments are next described with reference to FIGS. 23-31 with respect to a substrate fragment 10c. Like numerals from the above-described embodiments have been utilized where appropriate, with construction differences being indicated with the suffix "c" or with different numerals. While the suffix "c" indicates different construction, example material for such constructions is the same as used in the above embodiments for the same numerals without the suffix "c". Referring to FIG. 23, spaced first features 16c have been formed over substrate 12. An alterable material 40c has been deposited over spaced first features 16c.

Referring to FIG. 24, alterable material 40c has been altered with material from spaced first features 16c to form altered material 44c on sidewalls of spaced first features 16c. As described above, such altering may occur during deposition of alterable material 40c and/or after completion of deposition of alterable material 40c. In one embodiment, no altering occurs until after completion of deposition of alterable material 40c, for example essentially as depicted in the processing of the substrate of FIG. 23 to that of FIG. 24.

Figure 25:
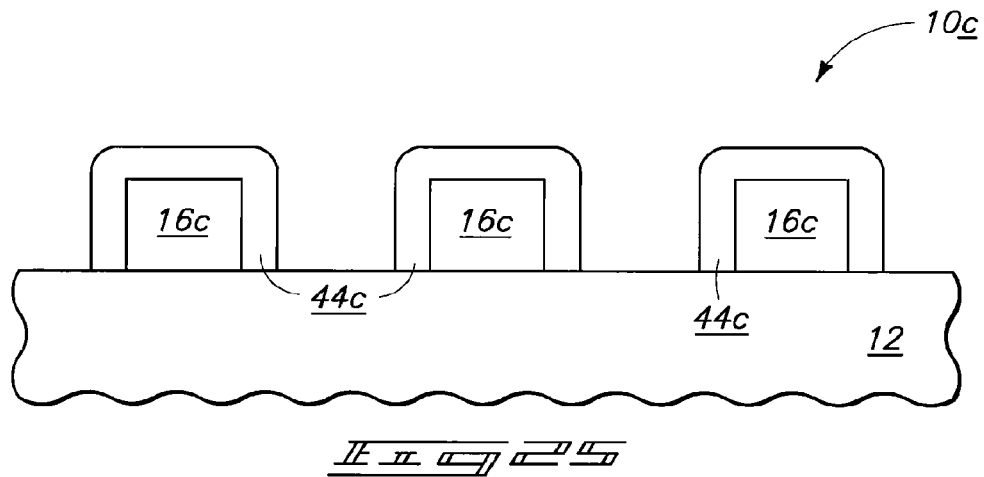
FIG. 25 is a view of the FIG. 24 substrate at a processing step subsequent to that shown by FIG. 24.

Referring to FIG. 25, those portions of the alterable material 40c (not shown) which were not altered have been removed from substrate 10c.

Figure 26:
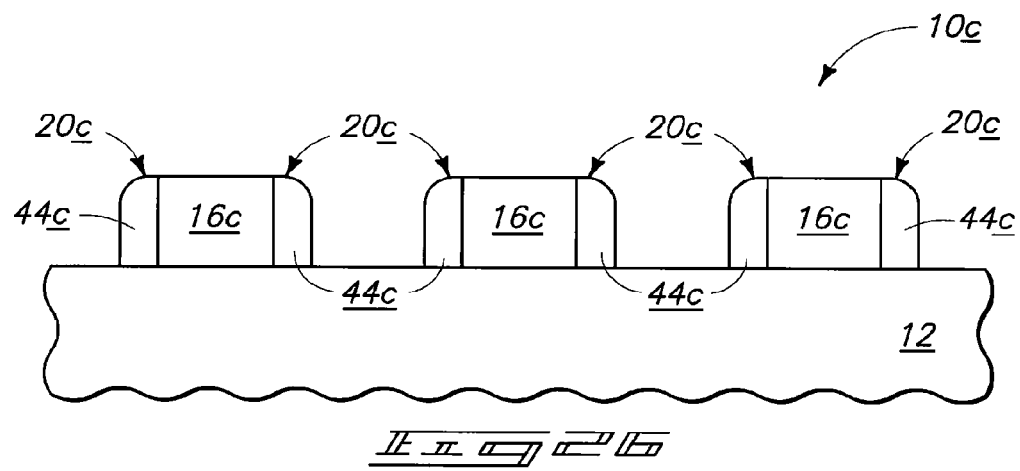
FIG. 26 is a view of the FIG. 25 substrate at a processing step subsequent to that shown by FIG. 25.

Referring to FIG. 26, altered material 44c has been anisotropically etched to form second spaced features 20c.

Figure 27:
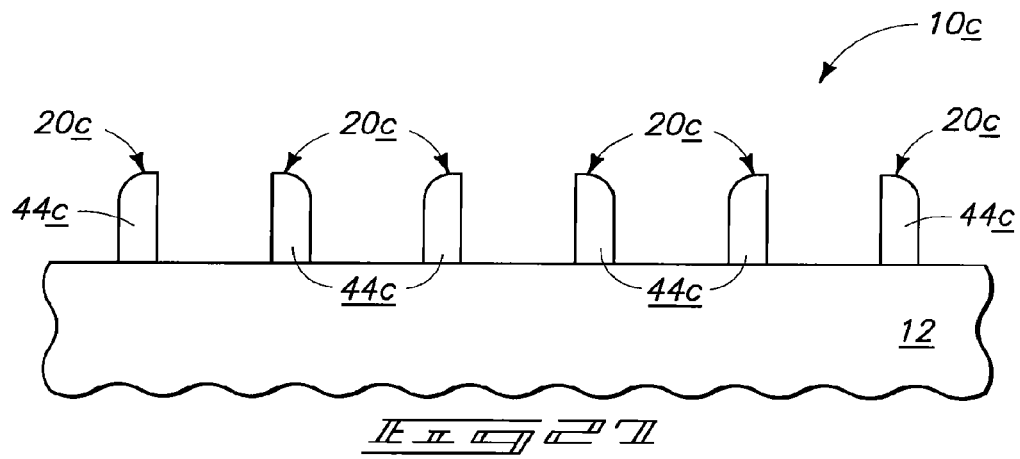
FIG. 27 is a view of the FIG. 26 substrate at a processing step subsequent to that shown by FIG. 26.

Referring to FIG. 27, spaced first features 16c (not shown) have been removed from the substrate leaving at least part of second spaced features 20c which comprise altered material 44c.

Figure 28:
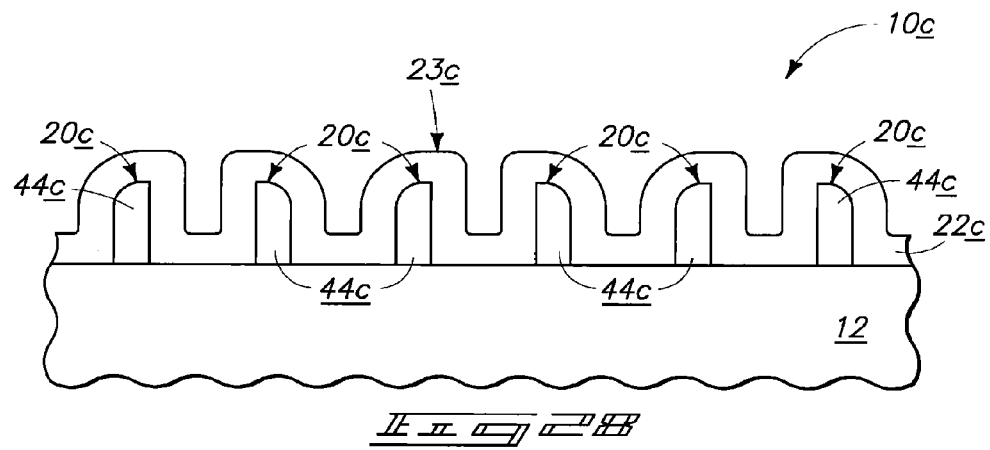
FIG. 28 is a view of the FIG. 27 substrate at a processing step subsequent to that shown by FIG. 27.

Referring to FIG. 28, a first material 22c has been deposited over spaced second features 20c, and which is of some different composition from that of spaced second features 20c and has a non-planar outermost surface 23c.

Figure 29:
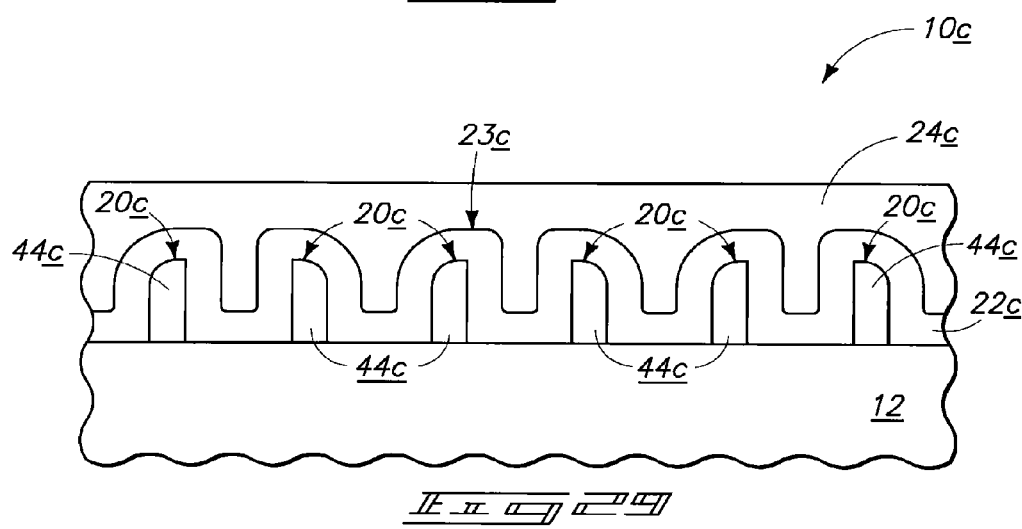
FIG. 29 is a view of the FIG. 28 substrate at a processing step subsequent to that shown by FIG. 28.

Referring to FIG. 29, a second material 24c has been deposited over first material 22c, with second material 24c being of some different composition from that of first material 22c and from that of spaced second features 20c.

Figure 30:
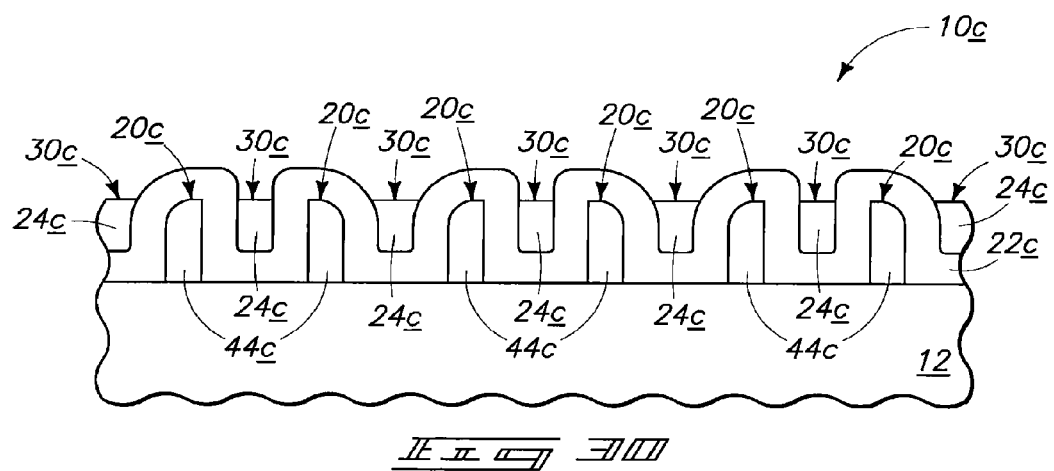
FIG. 30 is a view of the FIG. 29 substrate at a processing step subsequent to that shown by FIG. 29.

Referring to FIG. 30, only a portion of second material 24c has been removed to expose first material 22c and form spaced second material 30c.

Referring to FIG. 31, first material 22c has been etched from between spaced second material 30c, and spaced third features 32c have been formed which comprise spaced second material 24c. Third features 32c are spaced from second features 20c. The FIGS. 23-31 embodiment shows a starting pitch Q in FIG. 23 and a resultant pitch in FIG. 31 of one-fourth of Q (an integer factor of 4). Other multiplication, including non-integer fractional multiplication, may also result depending on thickness of the deposited materials and any laterally trimming of the formed features. Regardless, FIG. 31 depicts an example mask pattern 35c comprising spaced second features 20c and spaced third features 32c through which substrate 12 may be processed, for example as described above.

Additional embodiments are next described with reference to FIGS. 32-37. FIG. 32 depicts alternate processing with respect to a substrate fragment 10d in the processing sequence of FIG. 28. Like numerals from the above-described embodiments have been utilized where appropriate, with construction differences being indicated with the suffix "d" or with different numerals. While the suffix "d" indicates different construction, example material for such constructions is the same as used in the above embodiments for the same numerals without the suffix "d".

Referring to FIG. 32, the processing of FIGS. 23-27 has occurred wherein material 40c of FIG. 23 may be considered as first alterable material which was formed over spaced first features 16c, and which was altered with material from spaced first features 16c to form a first altered material 44c on sidewalls of spaced first features 16c. Spaced first features 16c have been removed from the substrate and spaced second features 20d were formed which comprise first altered material 44, which is designated as 44d in FIG. 32. A second alterable material 60 has been formed over spaced second features 20d. Composition and attributes of second alterable material 60 are the same as that described above for alterable material 40 and depending at least in part on composition of spaced second features 20d.

Referring to FIG. 33, second alterable material 60 has been altered with first altered material 44d from spaced second features/first altered material 20d to form second altered material 62 on sidewalls of spaced second features 20d. Composition and attributes of second altered material 62 are the same as that described above for altered material 44.

Referring to FIG. 34, unaltered second alterable material 60 (not shown) has been removed from the substrate selectively relative to second altered material 62.

Referring to FIG. 35, a third material 24d has been formed over second altered material 62. Third material 24d is of some different composition from that of second altered material 62 and from that of spaced second features 20d.

Referring to FIG. 36, only a portion of third material 24d has been removed to expose second altered material 62 and form spaced third material 30d.

Referring to FIG. 37, second altered material 62 (not shown) has been etched from between spaced third material 30d, and spaced third features 32d have been formed which comprise spaced third material 30d. Third features 32d are spaced from second features 20d. Additional lateral and/or vertical trimming may occur relative to the spaced second features and the spaced third features. Regardless, FIG. 37 depicts an example mask pattern 35d comprising spaced second features 20d and spaced third features 32d through which substrate material 12 received elevationally inward of mask pattern 35d can be processed, for example as described above.

Alternate processing to that depicted by FIGS. 34-37 is also contemplated. For example, second alterable material 60 of FIG. 33 might be processed such that only a portion thereof is removed to expose second altered material 62 and form spaced second alterable material as opposed to deposition of material 24d and removing a portion thereof. For example, material 60 of FIG. 33 could be removed to directly produce the construction of FIG. 36 wherein material 24d is substituted by second alterable material 60. Then, second altered material 62 is etched from between the spaced second alterable material and spaced third features are formed which comprise such spaced second alterable material. For example, the construction of FIG. 37 may be created where second alterable material is substituted for third material 24d.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of fabricating a substrate, comprising:
   forming spaced first features over a substrate;
   forming anisotropically etched spacers on sidewalls of the spaced first features;
   removing the spaced first features from the substrate and forming spaced second features which comprise the spacers;
   depositing a first material over the spaced second features which is of some different composition from that of the spaced second features, the first material having a non-planar outermost surface;
   depositing a second material over the first material, the second material being of some different composition from that of the first material and from that of the spaced second features, the second material having a planar outermost surface;
   removing only a portion of the second material to expose the first material and form spaced second material received over the first material; and
   after forming the spaced second material, etching the first material from between the spaced second material and forming spaced third features which comprise spaced second material received over first material, the third features being spaced from the second features.

2. The method of claim 1 wherein the spaced first features comprise photoresist.

3. The method of claim 1 wherein forming the spaced first features comprises forming spaced mask features followed by laterally trimming the spaced mask features to reduce their respective widths.

4. The method of claim 3 wherein the spaced second features and the spaced third features have pitch of about one third that of the spaced mask features.

5. The method of claim 1 wherein the spaced second features and the spaced third features have pitch of about one fourth that of the spaced first features.

6. The method of claim 1 comprising forming the spaced second features and the spaced third features to comprise pairs of immediately adjacent spaced second features which alternate with individual of the spaced third features.

7. The method of claim 1 comprising forming the spaced second features and the spaced third features to have one of the third features between each of adjacent of the second features.

8. The method of claim 1 wherein the first features are equally spaced from each adjacent of the first features, and the second features are not equally spaced from each adjacent of the second features.

9. The method of claim 8 wherein the first material is deposited to completely fill space between closest pairs of two immediately adjacent of the second features.

10. The method of claim 8 wherein the first material is deposited to less than completely fill space between closest pairs of two immediately adjacent of the second features.

11. The method of claim 1 wherein the first features are equally spaced from each adjacent of the first features, and the second features are equally spaced from each adjacent of the second features.

12. The method of claim 1 comprising laterally trimming width of the third features after the etching of the first material.

13. The method of claim 1 comprising depositing the first material to a minimum thickness which is less than that of the second material and less than maximum width of the spaced second features.

14. The method of claim 1 comprising after forming the third features, removing all of only some of the third features prior to the processing.

15. A method of fabricating a substrate, comprising:
    forming first and second spaced features over a substrate, the first spaced features having elevationally outermost regions which are different in composition from elevationally outermost regions of the second spaced features, the first and second spaced features alternating with one another; and
    removing every other first feature from the substrate and forming pairs of immediately adjacent second features which alternate with individual of remaining of the first features.

16. The method of claim 15 wherein the second features are homogenous.

17. The method of claim 15 wherein the removing comprises etching.

18. The method of claim 17 wherein no etch mask is received over any of the first features during the etching.

19. The method of claim 15 wherein the first features comprise a second material received over a different composition first material.

20. The method of claim 19 wherein the second features are of a composition which is different from that of the first and second materials.

21. A method of fabricating a substrate, comprising:
    forming first and second spaced features over a substrate, the first spaced features having elevationally outermost regions which are different in composition from elevationally outermost regions of the second spaced features, the first and second spaced features alternating with one another, the first spaced features comprising first and second materials;
    laterally etching the first and second materials selectively relative to the second features to remove every other first feature from the substrate and to reduce width of remaining of the first features and forming pairs of immediately adjacent second features which alternate with individual of the remaining of the first features.

22. The method of claim 21 wherein no etch mask is received over any of the first features during the etching.

23. The method of claim 21 wherein the second material is over and of different composition from the first material, the second features being of a composition which is different from that of the first and second materials.

24. A method of fabricating a substrate, comprising:
    forming spaced first features over a substrate;
    forming anisotropically etched spacers on sidewalls of the spaced first features;
    removing the spaced first features from the substrate and forming spaced second features which comprise the spacers;
    depositing an alterable material over the spaced second features and altering the alterable material with material from the spaced second features to form altered material on sidewalls of the spaced second features;
    depositing a second material over the altered material, the second material being of some different composition from that of the altered material and from that of the spaced second features;

removing only a portion of the second material to expose the altered material and form spaced second material; and after forming the spaced second material, etching the altered material from between the spaced second material and forming spaced third features which comprise the spaced second material, the third features being spaced from the second features.

25. The method of claim 24 wherein the altering occurs during deposition of the alterable material.

26. The method of claim 24 wherein the altering occurs after completion of the deposition of the alterable material.

27. The method of claim 24 wherein no altering occurs until after completion of the deposition of the alterable material.

28. The method of claim 24 wherein the altering alters a portion of the alterable material adjacent each of the spaced second features to form the altered material while leaving portions of the alterable material distal the spaced second features unaltered.

29. The method of claim 28 comprising etching the distal portions away selectively relative to the altered material prior to the depositing of the second material.

30. A method of fabricating a substrate, comprising:
forming spaced first features over a substrate;
forming anisotropically etched spacers on sidewalls of the spaced first features;
removing the spaced first features from the substrate and forming spaced second features which comprise the spacers;
depositing an alterable material over the spaced second features and altering only some of the alterable material with material from the spaced second features to form altered material on sidewalls of the spaced second features and leave alterable material elevationally over and between the altered material;
after the altering, removing only a portion of the alterable material to expose the altered material and form spaced alterable material; and
after forming the spaced alterable material, etching the altered material from between the spaced alterable material and forming spaced third features which comprise the spaced alterable material, the third features being spaced from the second features.

31. A method of fabricating a substrate, comprising:
forming spaced first features over a substrate;
depositing an alterable material over the spaced first features and altering the alterable material with material from the spaced first features to form altered material on sidewalls of the spaced first features;
after the altering, removing the spaced first features from the substrate and forming spaced second features which comprise the altered material;
depositing a first material over the spaced second features which is of some different composition from that of the spaced second features, the first material having a non-planar outermost surface;
depositing a second material over the first material, the second material being of some different composition from that of the first material and from that of the spaced second features;
removing only a portion of the second material to expose the first material and form spaced second material; and
after forming the spaced second material, etching the first material from between the spaced second material and forming spaced third features which comprise spaced second material, the third features being spaced from the second features.

32. The method of claim 31 wherein the depositing of the second material forms the second material to have a planar outermost prior any removing of the second material.

33. A method of fabricating a substrate, comprising:
forming spaced first features over a substrate;
depositing a first alterable material over the spaced first features and altering the first alterable material with material from the spaced first features to form first altered material on sidewalls of the spaced first features;
after the altering, removing the spaced first features from the substrate and forming spaced second features which comprise the first altered material;
depositing a second alterable material over the spaced second features and altering the second alterable material with first altered material from the spaced second features to form second altered material on sidewalls of the spaced second features;
depositing a third material over the second altered material, the third material being of some different composition from that of the second altered material and from that of the spaced second features;
removing only a portion of the third material to expose the second altered material and form spaced third material; and
after forming the spaced third material, etching the second altered material from between the spaced third material and forming spaced third features which comprise spaced third material, the third features being spaced from the second features.

34. The method of claim 33 wherein the spaced second features comprise photoresist and the second alterable material comprises one or more inorganic components dispersed in an organic composition that is cross-linkable upon exposure to acid, wherein the material from the spaced second features includes acid, and the altering the second alterable material comprises forming cross-links within the organic composition upon exposure to the acid in the material from the spaced second features.

35. The method of claim 34 wherein the one or more inorganic components includes silicon.

36. The method of claim 34 wherein the one or more inorganic components includes metal.

37. A method of fabricating a substrate, comprising:
forming spaced first features over a substrate;
depositing a first alterable material over the spaced first features and altering the first alterable material with material from the spaced first features to form first altered material on sidewalls of the spaced first features;
after the altering of the first alterable material, removing the spaced first features from the substrate and forming spaced second features which comprise the first altered material;
depositing a second alterable material over the spaced second features and altering only some of the second alterable material with first altered material from the spaced second features to form second altered material on sidewalls of the spaced second features and leave second alterable material elevationally over and between the second altered material;
after the altering of the second alterable material, removing only a portion of the second alterable material to expose the second altered material and form spaced second alterable material; and after forming the spaced second alterable material, etching the second altered material from between the spaced second alterable material and forming spaced third features which comprise spaced second alterable material, the third features being spaced from the second features.

38. A method of fabricating a substrate, comprising: forming first and second spaced features over a substrate, the first spaced features having elevationally outermost regions which are different in composition from elevationally outermost regions of the second spaced features, the first and second spaced features alternating with one another, the first spaced features comprising first and second materials; laterally etching the first and second materials selectively relative to the second features to remove every other first feature from the substrate and to reduce width of remaining of the first features and forming pairs of immediately adjacent second features which alternate with individual of the remaining of the first features; and after the laterally etching, processing the substrate through a mask pattern comprising the pairs of immediately adjacent second features which alternate with individual of the remaining of the first features.

39. The method of claim 38 wherein no etch mask is received over any of the first features during the etching.

40. The method of claim 38 wherein the second material is over and of different composition from the first material, the second features being of a composition which is different from that of the first and second materials.

41. The method of claim 1 wherein the mask pattern has pitch of about one third that of the spaced mask features.

42. The method of claim 1 wherein the mask pattern has pitch of about one fourth that of the spaced first features.

43. The method of claim 1 comprising forming the mask pattern to comprise pairs of immediately adjacent spaced second features which alternate with individual of the spaced third features.

44. The method of claim 1 comprising forming the mask pattern to have one of the third features between each of adjacent of the second features.

45. The method of claim 1 wherein the first features are equally spaced from each adjacent of the first features, and the second features are not equally spaced from each adjacent of the second features.

46. The method of claim 45 wherein the first material is deposited to less than completely fill space between closest pairs of two immediately adjacent of the second features.

47. The method of claim 24 wherein the mask pattern comprises two spaced second features between adjacent spaced third features.

48. The method of claim 31 wherein the mask pattern has pitch of about one fourth that of the spaced first features.

* * * * *